(12) United States Patent
Ishida et al.

(10) Patent No.: US 8,742,553 B2
(45) Date of Patent: Jun. 3, 2014

(54) PRINTED WIRING BOARD

(71) Applicant: Ibiden Co., Ltd., Ogaki (JP)

(72) Inventors: Naoto Ishida, Ogaki (JP); Takema Adachi, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 4 days.

(21) Appl. No.: 13/690,570

(22) Filed: Nov. 30, 2012

(65) Prior Publication Data
US 2013/0221518 A1 Aug. 29, 2013

Related U.S. Application Data

(60) Provisional application No. 61/604,011, filed on Feb. 28, 2012.

(51) Int. Cl.
H01L 23/495 (2006.01)

(52) U.S. Cl.
USPC ............ 257/668; 257/698; 257/E23.067; 257/E23.174

(58) Field of Classification Search
USPC ........... 257/276, 668, 698, E23.067, E23.174
See application file for complete search history.

(56) References Cited

U.S. PATENT DOCUMENTS 8,186,053 B2 * 5/2012 Yokouchi et al. ............... 29/852

FOREIGN PATENT DOCUMENTS

JP 2011-100908 5/2011

* cited by examiner

Primary Examiner — Hoai V Pham
(74) Attorney, Agent, or Firm — Oblon, Spivak, McClelland, Maier & Neustadt, L.L.P.

(57) ABSTRACT

A printed wiring board includes a core substrate, a first buildup layer laminated on a first surface of the core substrate and including the outermost interlayer resin insulation layer and the outermost conductive layer formed on the outermost interlayer resin insulation layer of the first buildup layer, and a second buildup layer laminated on a second surface of the core substrate and including the outermost interlayer resin insulation layer and the outermost conductive layer formed on the outermost interlayer resin insulation layer of the second buildup layer. The outermost conductive layer of the first buildup layer includes pads positioned to mount a semiconductor device on a surface of the first buildup layer, and the outermost interlayer resin insulation layer of the first buildup layer has a thermal expansion coefficient which is set lower than a thermal expansion coefficient of the outermost interlayer resin insulation layer of the second buildup layer.

20 Claims, 17 Drawing Sheets

FIG. 2
(A)
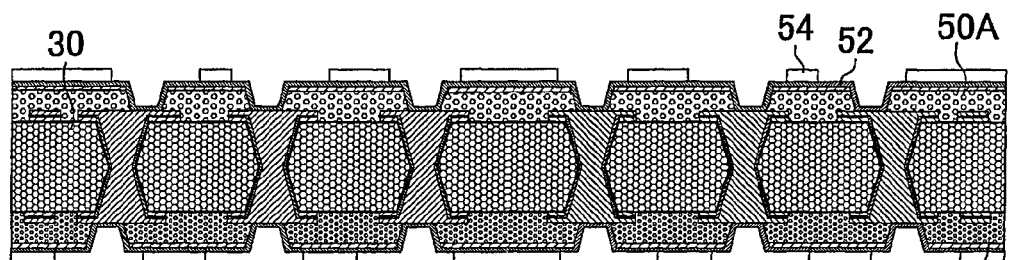
(B)
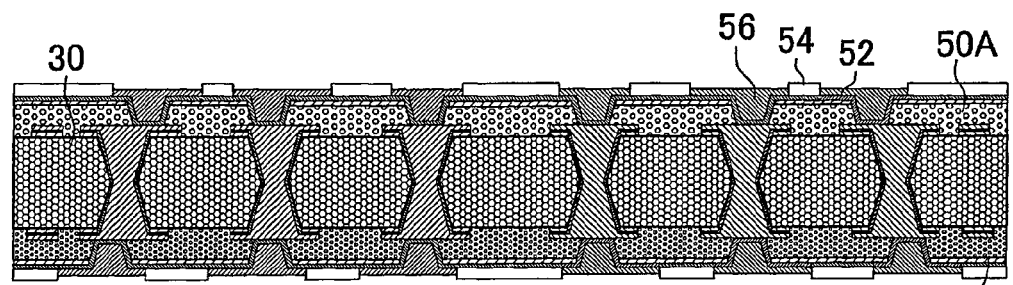
(C)
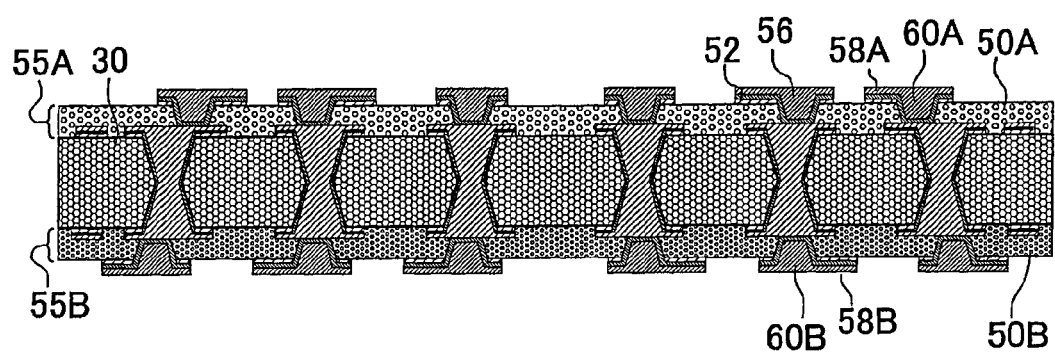

FIG. 3
(A)
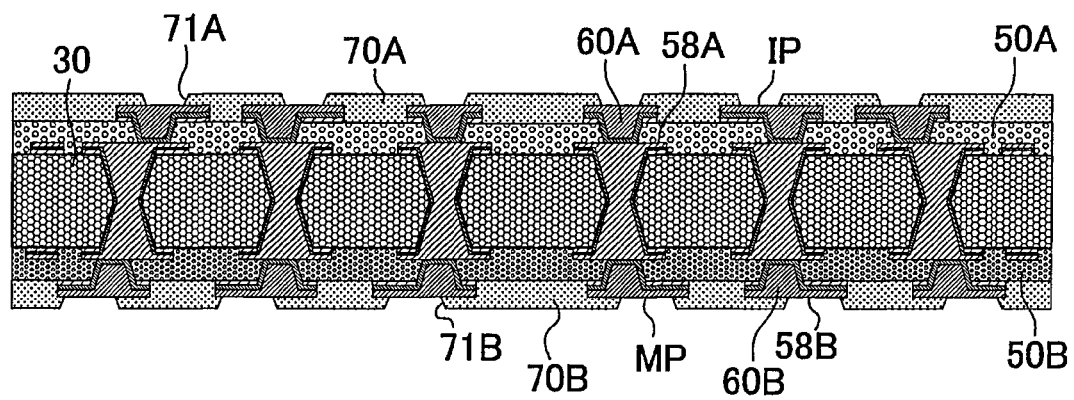
(B)
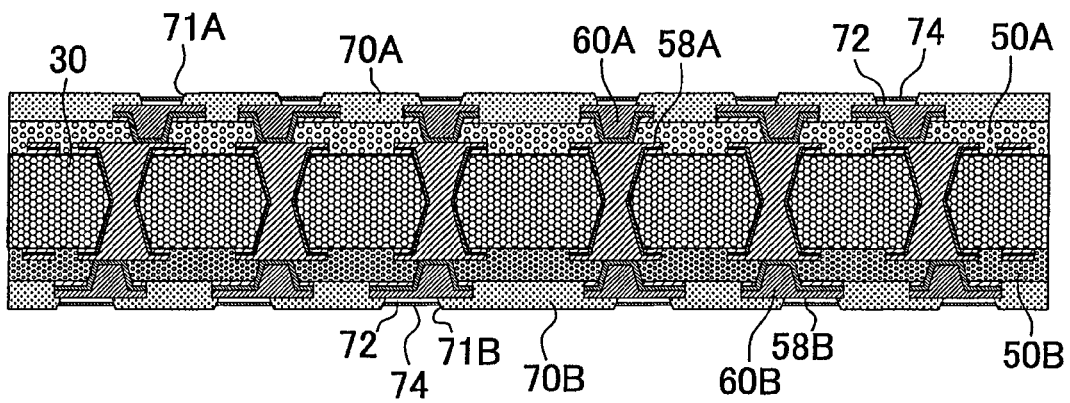

FIG. 8
(A)
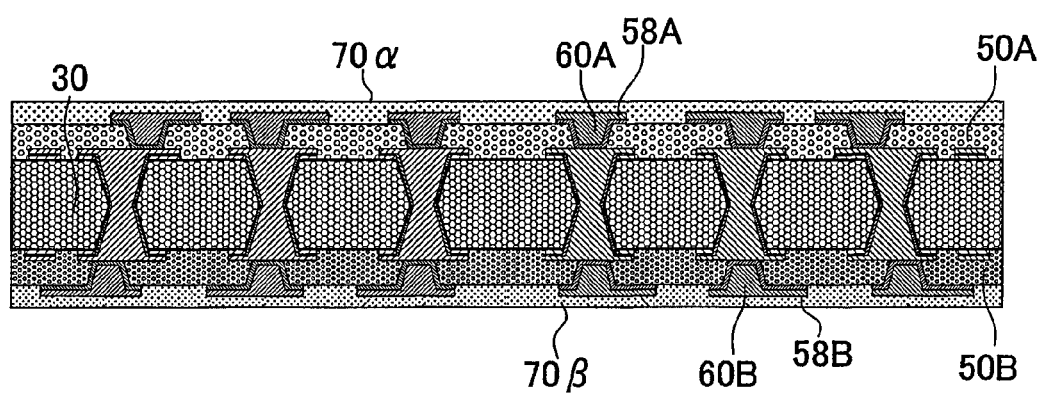
(B)
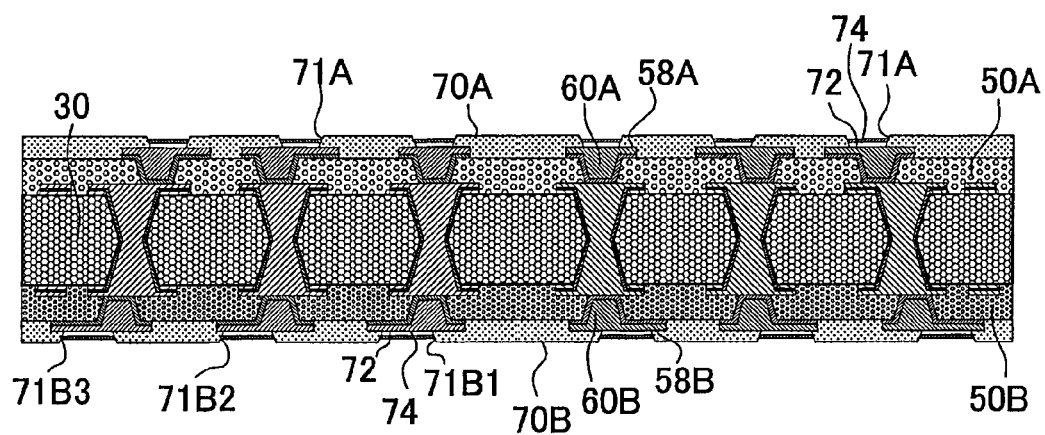

FIG. 14
(A)
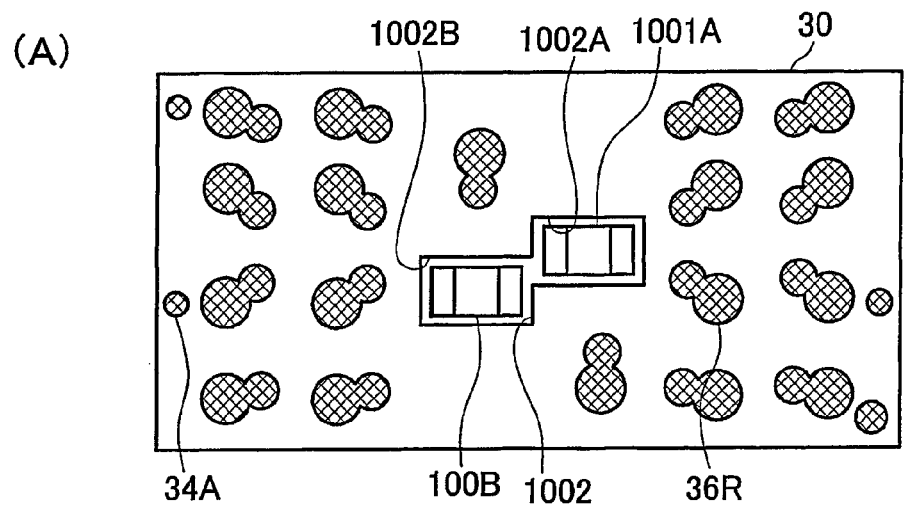
(B)
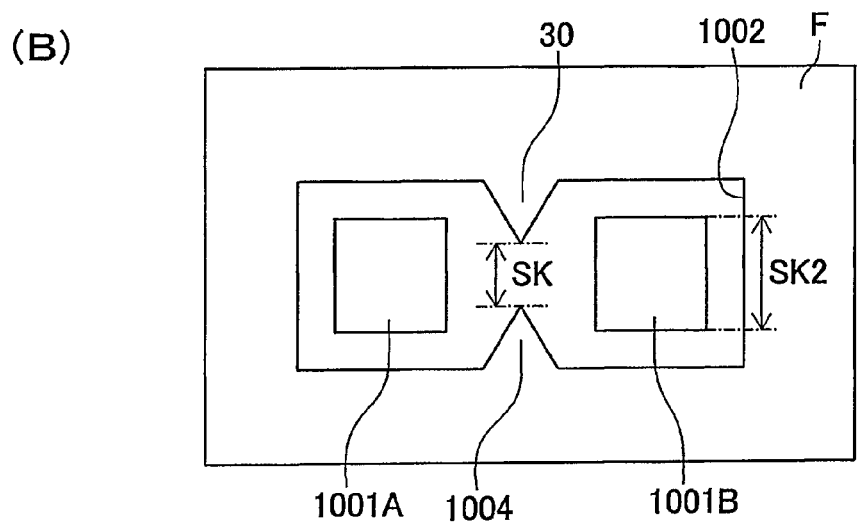
(C)
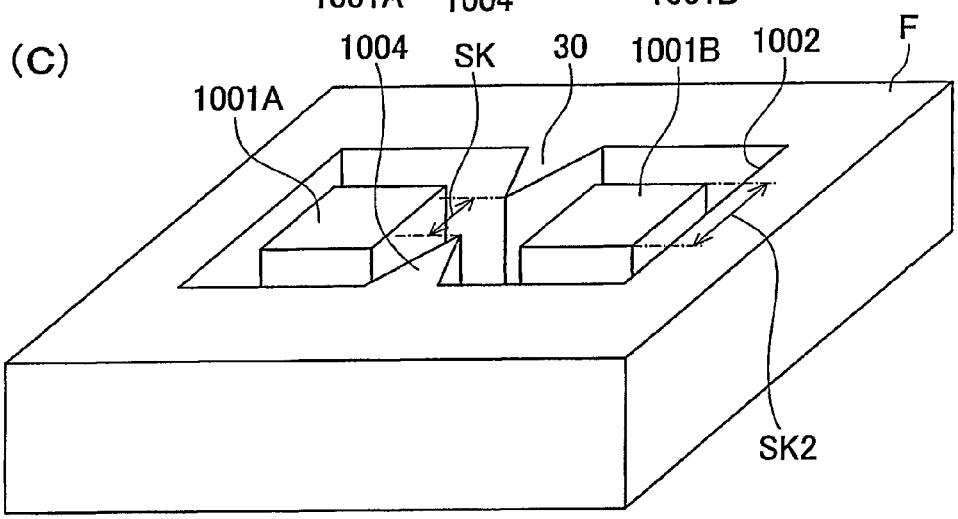

FIG. 17
(A)
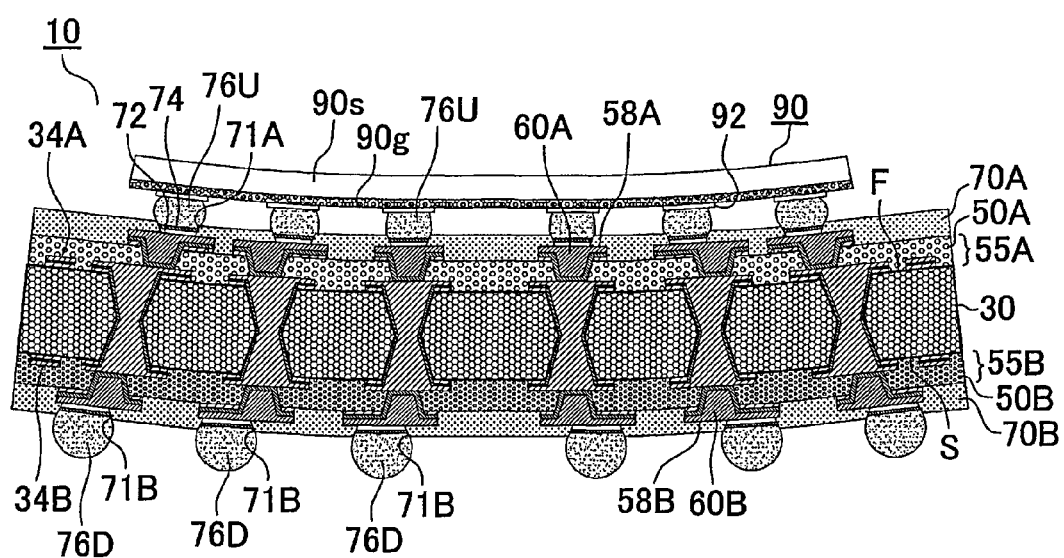
(B)
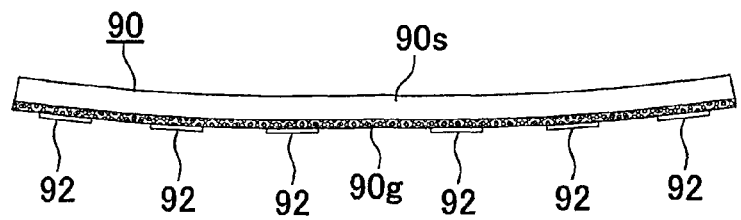

US 8,742,553 B2

PRINTED WIRING BOARD

CROSS-REFERENCE TO RELATED APPLICATIONS

The present application is based upon and claims the benefit of priority from U.S. Application No. 61/604,011, filed Feb. 28, 2012, the entire contents of which are incorporated herein by reference.

BACKGROUND OF THE INVENTION

1. Field of the Invention

The present invention relates to a printed wiring board formed with a core substrate, an upper buildup layer and a lower buildup layer.

2. Description of Background Art

Japanese Laid-Open Patent Publication No. 2011-100908 relates to a printed wiring board having through holes (penetrating holes) formed by using a laser. In Japanese Laid-Open Patent Publication No. 2011-100908, a printed wiring board has a through hole that becomes narrower from an upper surface toward a lower surface of a core substrate and a through hole that become narrower from the lower surface toward the upper surface so that warping of the printed wiring board is reduced. The entire contents of this publication are incorporated herein by reference.

SUMMARY OF THE INVENTION

According to one aspect of the present invention, a printed wiring board includes a core substrate having a first surface and a second surface on the opposite side of the first surface, a first buildup layer laminated on the first surface of the core substrate and including the outermost interlayer resin insulation layer and the outermost conductive layer formed on the outermost interlayer resin insulation layer of the first buildup layer, and a second buildup layer laminated on the second surface of the core substrate and including the outermost interlayer resin insulation layer and the outermost conductive layer formed on the outermost interlayer resin insulation layer of the second buildup layer. The outermost conductive layer of the first buildup layer includes pads positioned to mount a semiconductor device on a surface of the first buildup layer, and the outermost interlayer resin insulation layer of the first buildup layer has a thermal expansion coefficient which is set lower than a thermal expansion coefficient of the outermost interlayer resin insulation layer of the second buildup layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(A)-2(C) are views of steps showing a method for manufacturing a printed wiring board according to the first embodiment;

FIGS. 3(A)-3(B) are views of steps showing a method for manufacturing a printed wiring board according to the first embodiment;

FIGS. 8(A)-8(B) are views of steps showing a method for manufacturing a printed wiring board according to a third embodiment;

FIGS. 14(A) and 14(B) are plan views of a core substrate according to the fourth embodiment, and FIG. 14(C) is a perspective view of FIG. 14(B);

FIG. 17(A) is an applied example of the first embodiment, and FIG. 17(B) is a view schematically showing warping of an IC chip at a reflow temperature.

DETAILED DESCRIPTION OF THE EMBODIMENTS

Figure 1:
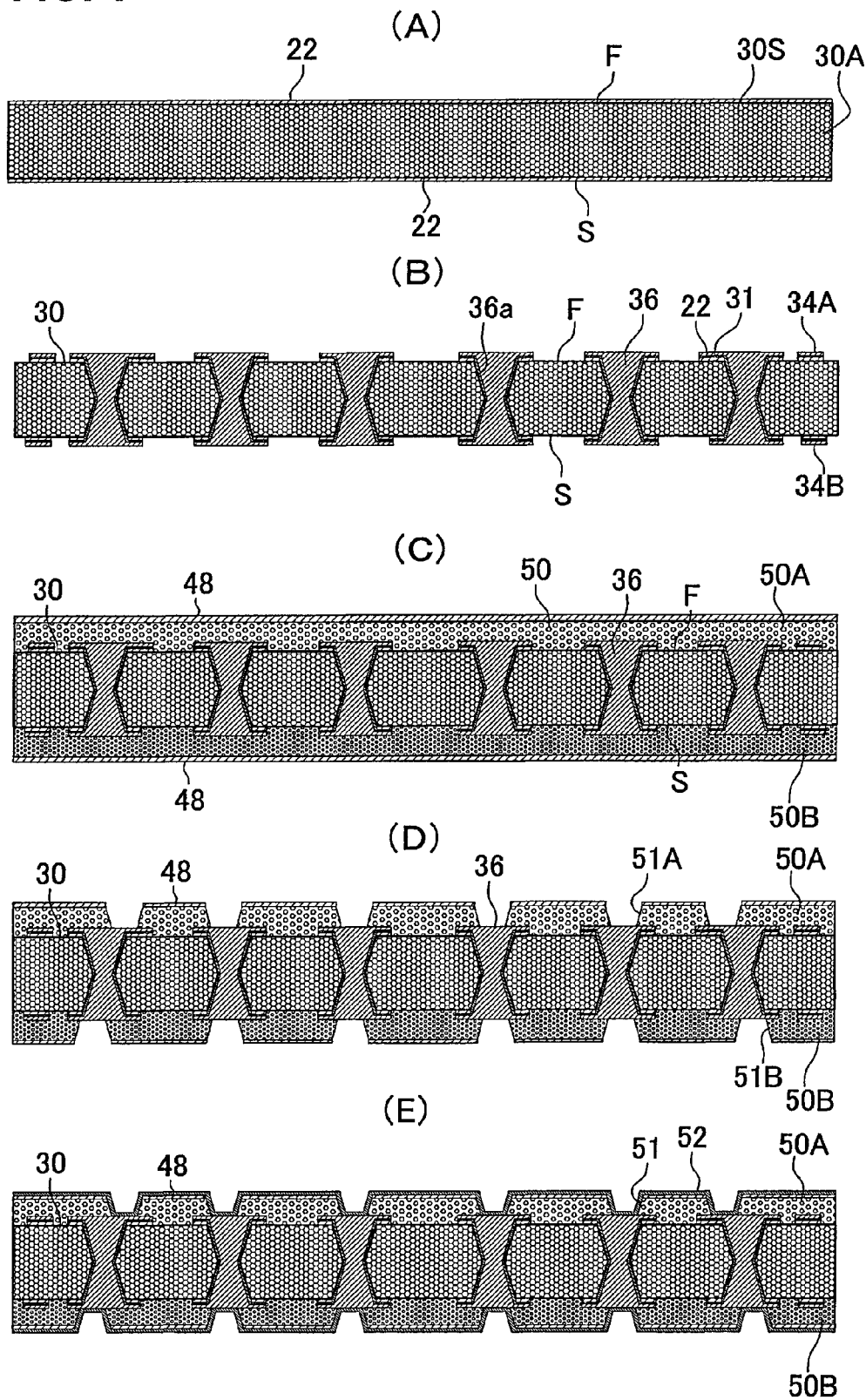
FIGS. 1(A)-1(E) are views of steps showing a method for manufacturing a printed wiring board according to a first embodiment of the present invention.

The embodiments will now be described with reference to the accompanying drawings, wherein like reference numerals designate corresponding or identical elements throughout the various drawings.

First Embodiment

Figure 7:
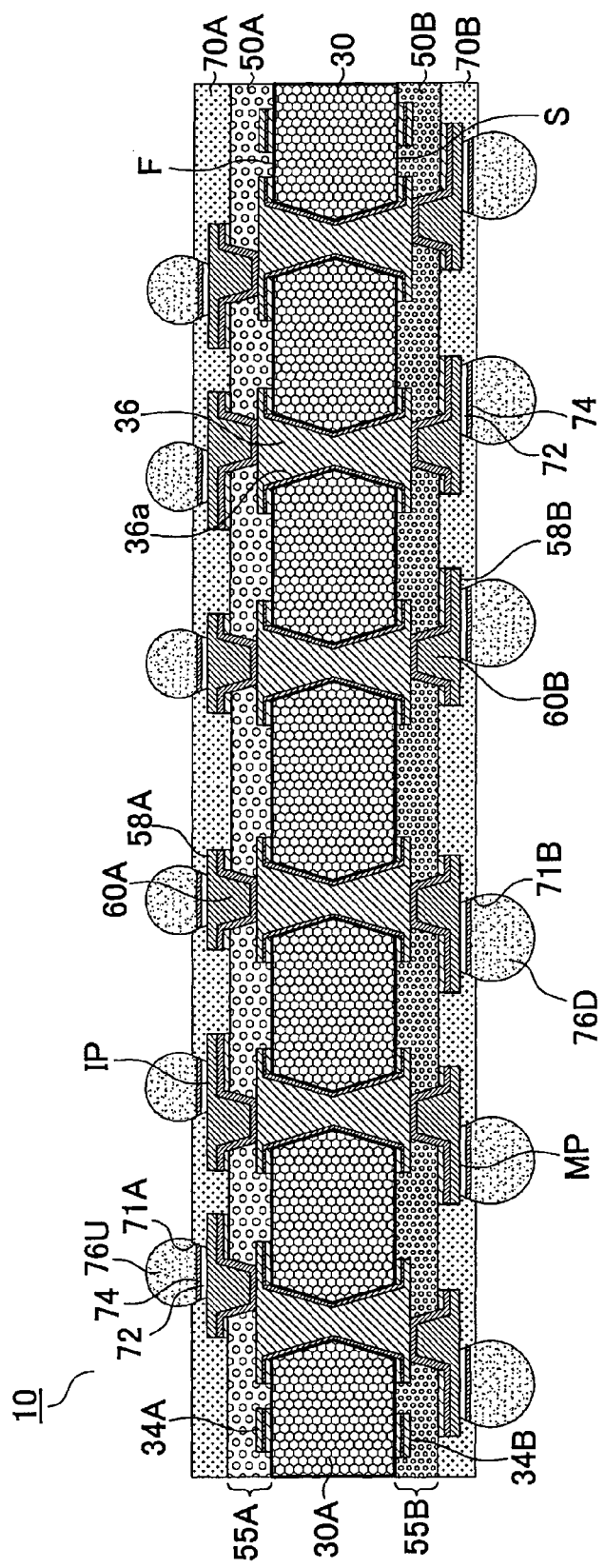
FIG. 7 is a cross-sectional view of a printed wiring board according to the first embodiment.

A printed wiring board according to a first embodiment of the present invention is shown in FIG. 7.

Printed wiring board 10 of the first embodiment has core substrate 30. The core substrate has insulative substrate (30A) having first surface (F) and second surface (S) opposite the first surface, first conductive layer (34A) formed on first surface (F) of the insulative substrate, and second conductive layer (34B) formed on the second surface of the insulative substrate. The core substrate further includes through-hole conductors 36 connecting first conductive layer (34A) and second conductive layer (34B). Through-hole conductors are formed in penetrating holes (36a) penetrating through the insulative substrate. Penetrating holes (36a) and through-hole conductors have an hourglass shape. The core substrate shown in FIG. 7 may be manufactured by a method described in U.S. Pat. No. 7,786,390, for example. The entire contents of this publication are incorporated herein by reference. The conductive layers of the core substrate include multiple conductive circuits and through-hole lands formed around through-hole conductors. The first surface of the core substrate corresponds to the first surface of the insulative substrate, and the second surface of the core substrate corresponds to the second surface of the insulative substrate.

Figure 6:
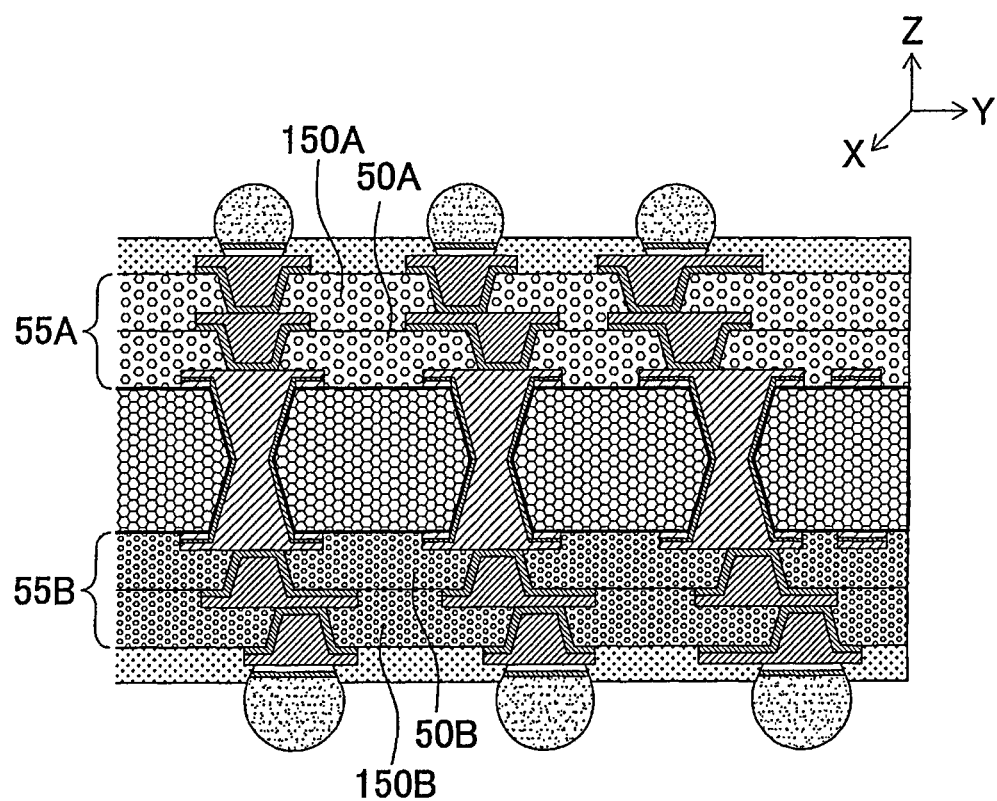
FIG. 6 is a view showing a cross section of a printed wiring board and axes.

Uppermost interlayer resin insulation layer (50A) is formed on first surface (F) of core substrate 30 and on first conductive layer (34A). Uppermost conductive layer (58A) is formed on interlayer resin insulation layer (50A). Uppermost conductive layer (58A) is connected to first conductive layer (34A) and through-hole conductors by uppermost via conductors (60A) penetrating through uppermost interlayer resin insulation layer (50A). Upper buildup layer (55A) is formed with uppermost interlayer resin insulation layer (50A), uppermost conductive layer (58A) and uppermost via conductors (60A). In the first embodiment, the upper buildup layer is single layered. FIG. 6 shows a cross-sectional view of the printed wiring board and directions (X, Y, Z). The later-described thermal expansion coefficients and Young's moduli are the values in directions X-Y. The cross-sectional direction of a printed wiring board is direction Z. The unit of thermal expansion coefficients is 1/K.

Lowermost interlayer resin insulation layer (50B) is formed on second surface (S) of core substrate 30 and on second conductive layer (34B). Lowermost conductive layer (58B) is formed on lowermost interlayer resin insulation layer (50B). Lowermost conductive layer (58B) is connected to second conductive layer (34B) and through-hole conductors by lowermost via conductors (60B) penetrating through lowermost interlayer resin insulation layer (50B). Lower buildup layer (55B) is formed with lowermost interlayer resin insulation layer (50B), lowermost conductive layer (58B) and lowermost via conductors (60B). In the first embodiment, the lower buildup layer is single layered. The thermal expansion coefficient of the uppermost interlayer resin insulation layer is lower than that of the lowermost interlayer resin insulation layer.

Upper solder-resist layer (70A) is formed on the upper buildup layer, and lower solder-resist layer (70B) is formed on the lower buildup layer. Solder-resist layer (70A) has openings (71A) that expose upper surfaces of the uppermost conductive layer and uppermost via conductors. Solder-resist layer (70B) has openings (71B) that expose upper surfaces of the lowermost conductive layer and lowermost via conductors. Portions exposed through openings (71A, 71B) of solder-resist layers (70A, 70B) work as pads; the upper buildup layer has C4 pads (IP) and the lower buildup layer has BGA pads (MP). Solder bumps (C4 bumps) (76U) are formed on C4 pads, and solder bumps (BGA bumps) (76D) are formed on BGA pads.

FIG. 17(A) shows how to use a printed wiring board of the first embodiment. As shown in FIG. 17(A), IC chip 90 can be mounted on printed wiring board 10 of the first embodiment. Generally, an IC chip is mounted on a printed wiring board through C4 bumps by a reflow process. IC chip 90 is formed with substrate (90*s*) made of silicon and wiring layer (90*g*) having wiring and an insulation layer. Electrodes 92 for connection with a printed wiring board are formed in wiring layer (90*g*). The thermal expansion coefficient of substrate (90*s*) is set lower than that of wiring layer (90*g*). Since thermal expansion coefficients are different in substrate (90*s*) and wiring layer (90*g*), the IC chip tends to warp during a reflow process (FIG. 17(B)). The IC chip is thought to warp in a substantially arc shape at a reflow temperature. When an IC chip is placed on a flat board so that the wiring layer of the IC chip makes contact with the board, the IC chip warps in such a way that the periphery of the IC chip is elevated off the board. The IC chip and printed wiring board at a reflow temperature are shown in FIG. 17.

When an IC chip is thinner, since its rigidity decreases, the amount of warping is thought to increase. Also, when an IC chip is enlarged, the amount of warping is thought to increase. Therefore, when an IC chip is thinner or an IC chip is larger, it is thought to be harder to mount such an IC chip on a printed wiring board by a reflow process.

For a printed wiring board to follow the warping of an IC chip at a mounting temperature, the thermal expansion coefficient of the uppermost interlayer resin insulation layer is set lower than that of the lowermost interlayer resin insulation layer in the first embodiment. Since the thermal expansion coefficient of the uppermost interlayer resin insulation layer is set lower than that of the lowermost interlayer resin insulation layer, the direction of warping in the printed wiring board and the direction of warping in the IC chip tend to be the same at a reflow temperature (mounting temperature). To set different thermal expansion coefficients in the uppermost interlayer resin insulation layer and the lowermost interlayer resin insulation layer is achieved by setting the amount of inorganic particles and the amount of resin to be different in those interlayer resin insulation layers, for example. Other than that, thermal expansion coefficients can also be set different by changing the type and amount of reinforcing material contained in interlayer resin insulation layers. When the amount (wt. %) of inorganic particles such as silica or the amount (wt. %) of reinforcing material such as glass cloth is increased, or when the amount (wt. %) of resin is reduced, the thermal expansion coefficient of an interlayer resin insulation layer becomes lower. When the amounts of resin are different in different interlayer resin insulation layers, the difference in the amounts (wt. %) of resin is preferred to be within 13 wt. %. When the uppermost interlayer resin insulation layer and the lowermost interlayer resin insulation layer contain glass cloth made of the same material (glass cloth made of T-glass), the difference between the amount (wt. %) of resin in the uppermost interlayer resin insulation layer and the amount (wt. %) of resin in the lowermost interlayer resin insulation layer is preferred to be 7 wt. % or lower. For example, the amount of resin in the uppermost interlayer resin insulation layer is 67 wt. %, and the amount of resin in the lowermost interlayer resin insulation layer is 73 wt. %. Delamination does not occur between uppermost and lowermost interlayer resin insulation layers and the core substrate or later-described upper and lower interlayer resin insulation layers.

In addition, when the film thickness is different in different interlayer resin insulation layers, the difference in film thicknesses (μm) is preferred to be within 5 μm. Warping of the printed wiring board is easier to control. For example, the film thickness of the uppermost interlayer resin insulation layer is 35 μm, and the film thickness of the lowermost interlayer resin insulation layer is 30 μm. The film thickness of the uppermost interlayer resin insulation layer is preferred to be greater than that of the lowermost interlayer resin insulation layer.

When the thermal expansion coefficients of uppermost and lowermost interlayer resin insulation layers are set to be different by the amount (wt. %) of reinforcing material or the amount (wt. %) of inorganic particles, the uppermost and lowermost interlayer resin insulation layers are preferred to contain inorganic particles of the same material. The reinforcing material contained in the uppermost and lowermost interlayer resin insulation layers may be of different materials. When the materials are different, the thermal expansion coefficient of the reinforcing material contained in the uppermost interlayer resin insulation layer is preferred to be lower than the thermal expansion coefficient of the reinforcing material contained in the lowermost interlayer resin insulation layer.

The reinforcing material contained in the uppermost interlayer resin insulation layer is glass cloth made of T-glass, and the reinforcing material contained in the lowermost interlayer resin insulation layer is glass cloth made of E-glass. Alternatively, the uppermost and lowermost interlayer resin insulation layers contain glass cloth made of T-glass, and the amounts (wt. %) of resin are different in the uppermost and lowermost interlayer resin insulation layers. This makes it easier to control warping.

The value (PU), obtained when the thermal expansion coefficient of a lowermost interlayer resin insulation layer is divided by the thermal expansion coefficient of an uppermost interlayer resin insulation layer, is greater than 1 but 1.5 or smaller. Such thermal expansion coefficients and PU are preferred to be values at a reflow temperature, and the reflow temperature is 220 degrees, for example. The direction of warping in an IC chip and the direction of warping in a printed wiring board become the same. If PU is 1 or smaller, the gap between an IC chip and a printed wiring board increases at the periphery of the IC chip. Accordingly, electrodes at the periphery of the IC chip may not be connected to C4 pads of the printed wiring board; or electrodes at the periphery of the IC chip may be detached from the printed wiring board due to stress during usage. If PU exceeds 1.5, warping becomes too great. Accordingly, electrodes in the central portion of an IC chip may not be connected to C4 pads of a printed wiring board; or electrodes in the central portion of the IC chip may be detached from the printed wiring board due to stress during usage.

PU is preferred to be greater than 1.1 but smaller than 1.5. The amount of warping of an IC chip and the amount of warping of a printed wiring board become substantially the same.

In the present embodiment, the thermal expansion coefficient (CTE) of uppermost interlayer resin insulation layer (50A) is lower than that of lowermost interlayer resin insulation layer (50B) at 220 degrees. The thermal expansion coefficient of the uppermost interlayer resin insulation layer is 8 ppm to 20 ppm, and the thermal expansion coefficient of the lowermost interlayer resin insulation layer is 15 ppm to 22 ppm. The direction of warping in an IC chip becomes the same as the direction of warping in the printed wiring board. Moreover, the thermal expansion coefficient of uppermost interlayer resin insulation layer (50A) at 220 degrees is preferred to be 16 ppm or lower. The amount of warping of an IC chip becomes closer to the amount of warping of the printed wiring board.

In addition, the value (GU), obtained when the thermal expansion coefficient (CTE) of reinforcing material such as glass cloth in lowermost interlayer resin insulation layer (50B) is divided by the thermal expansion coefficient of reinforcing material such as glass cloth in the uppermost interlayer resin insulation layer at a reflow temperature, is preferred to be 1.5 or greater but 2.5 or smaller. When GU is within such a range and PU is within the range described above, the strength in interlayer resin insulation layers is enhanced. Cracks seldom occur in interlayer resin insulation layers even when a printed wiring board warps.

When reinforcing materials are different in uppermost and lowermost interlayer resin insulation layers, the thermal expansion coefficient of the reinforcing material contained in the uppermost interlayer resin insulation layer is 2 ppm to 4 ppm, and the thermal expansion coefficient of the reinforcing material contained in the lowermost interlayer resin insulation layer is 4 ppm to 6 ppm. Such thermal expansion coefficients are preferred to be values at 195 degrees~280 degrees. This makes it easier to control warping of the printed wiring board at a reflow temperature. It is further preferred that the thermal expansion coefficients be values at 195 degrees~255 degrees. Defects such as warping, connection failure and the like at high temperature decrease.

In the first embodiment, warping occurs in a printed wiring board during a reflow process. Therefore, in the first embodiment, Young's modulus (modulus of tensile elasticity) of interlayer resin insulation layers at a high temperature is preferred to be a predetermined value (range). For example, Young's modulus is preferred to be a predetermined value (range) when the temperature range is between 195 degrees and 280 degrees. In particular, Young's modulus at 260 degrees is important. Young's modulus is a value in directions X-Y shown in FIG. 6. Especially, when Young's modulus in a range of 195 degrees to 260 degrees is within a predetermined range, cracks are unlikely to occur in interlayer resin insulation layers.

Value (YU), obtained when Young's modulus of uppermost interlayer resin insulation layer (50A) is divided by Young's modulus of lowermost interlayer resin insulation layer (50B), is preferred to be 1.05 to 2. The direction of warping in an IC chip and the direction of warping in a printed wiring board at a reflow temperature become the same. Furthermore, YU is preferred to be 1.6 or smaller. The distance between an IC chip and a printed wiring board at a reflow temperature becomes substantially the same on each C4 pad.

Specific values are: Young's modulus of the uppermost interlayer resin insulation layer is 13 GPa to 22 GPa; and Young's modulus of the lowermost interlayer resin insulation layer is 8 GPa to 16 GPa. Young's modulus of the uppermost interlayer resin insulation layer is preferred to be greater than Young's modulus of the lowermost interlayer resin insulation layer and greater than 15 GPa.

Value (EU), obtained when Young's modulus of the reinforcing material such as glass cloth contained in the uppermost interlayer resin insulation layer is divided by Young's modulus of the reinforcing material contained in the lowermost interlayer resin insulation layer, is preferred to be 1.05 or greater but 1.2 or smaller. When EU exceeds 1.2, cracks are thought to occur in lowermost interlayer resin insulation layer (50B). When EU is smaller than 1.05, cracks are thought to occur in uppermost interlayer resin insulation layer (50A).

The printed wiring board according to the first embodiment is suitable for a printed wiring board to mount an IC chip with a thickness in the range of 0.05 mm to 0.15 mm. When the thickness of an IC chip is less than 0.05 mm, warping of the IC chip is too great at a reflow temperature (mounting temperature). Connection failure tends to occur between the IC chip and the printed wiring board. When the thickness of an IC chip exceeds 0.15 mm, the IC chip is heavy. When an IC chip is heavy, the IC chip tends to sink due to its own weight during a reflow process. Accordingly, when the pitch of C4 pads is 150 µm or less, short circuiting may occur between adjacent solder bumps (C4 bumps). Here, C4 bumps are solder bumps formed on pads (C4 pads) (IP) for mounting an IC chip, and are shown as (76U) in FIG. 7. The pitch of C4 pads is the distance between the center of a pad and the center of its adjacent pad.

Figure 16:
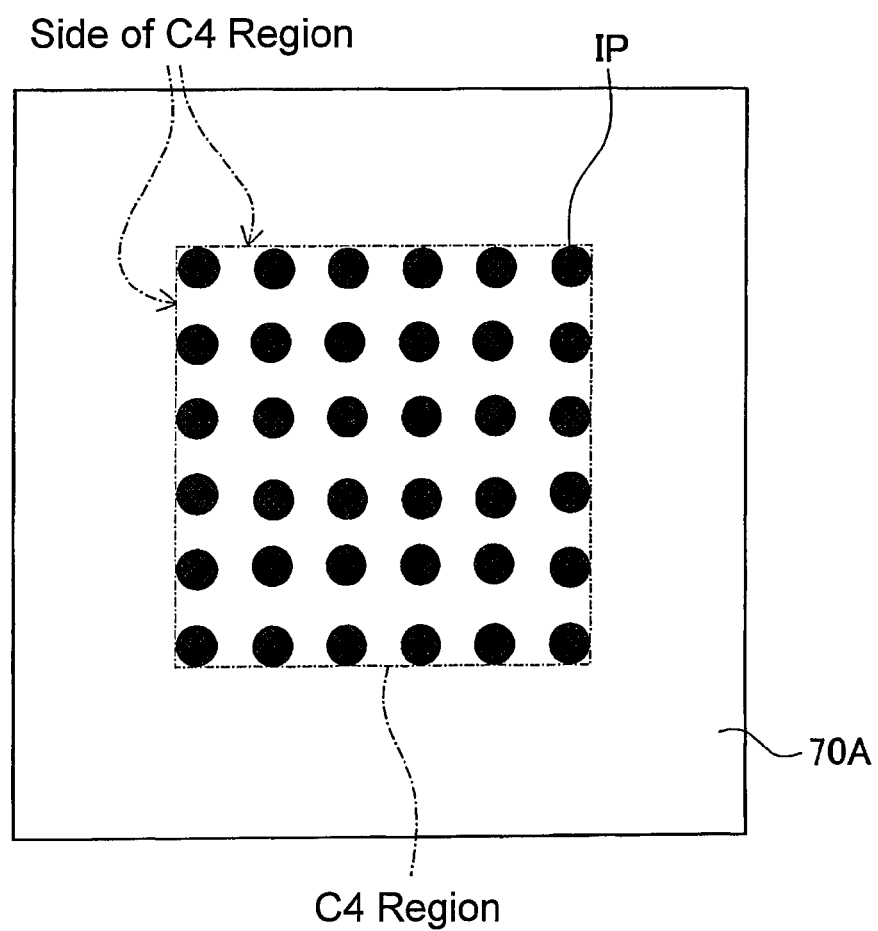
FIG. 16 is a plan view showing a C4 region.

C4 pads are formed in a predetermined rectangular region (C4 region) (FIG. 16). The C4 region is a region that includes all the C4 pads, and its short sides and long sides are determined to make the area as small as possible. When the thickness of an IC chip exceeds 0.15 mm, C4 bumps formed in the central portion of the C4 region may not be connected to electrodes of the IC chip.

In a printed wiring board of the first embodiment, each side of the C4 region is preferred to be 8 mm~15 mm. The size of the C4 region and the size of an IC chip are substantially the same. When the length of a side is less than 8 mm, warping of an IC chip during the reflow process seldom causes serious problems. When the length of a side exceeds 15 mm, it is difficult for the printed wiring board of the first embodiment to follow the warping of an IC chip at a mounting temperature.

In the first embodiment, the direction and amount of warping in a printed wiring board at a mounting temperature are controlled to follow the direction and amount of warping in an IC chip as described above. The printed wiring board warps at a reflow temperature in such a way that the central portion of the uppermost interlayer resin insulation layer is recessed. Since a printed wiring board and an IC chip warp in the same direction, the mounting yield of the IC chip is high. Distances between electrodes of an IC chip and C4 pads are substantially the same in the C4 region at the reflow temperature. Connection reliability is enhanced between the printed wiring board and the IC chip.

Since a printed wiring board warps to follow the warping of an IC chip at a mounting temperature in the embodiment, the mounting yield of the IC chip is enhanced. Also, the connection reliability of solder bumps (76U) is improved. Each interlayer resin insulation layer of a printed wiring board in the embodiment is preferred to contain reinforcing material such as glass cloth. Even if the printed wiring board warps, cracks are prevented from occurring in interlayer resin insulation layers because of reinforcing material. Each side of a printed wiring board is preferred to be 15 mm to 25 mm. When the length is less than 15 mm, warping of an IC chip seldom causes problems. When the length exceeds 25 mm, it is difficult to align the warping of a printed wiring board with the warping of an IC chip.

Method for Manufacturing Printed Wiring Board of the First Embodiment

FIGS. 1~3 show a method for manufacturing printed wiring board 10 of the first embodiment.

(1) Double-sided copper-clad laminate (30S) is prepared, which is made up of insulative substrate (30A) having a first surface and a second surface opposite the first surface and metal foil laminated on both of its surfaces (FIG. 1(A)). As for the double-sided copper-clad laminate, ELC4785TH-G made by Sumitomo Bakelite Co., Ltd. is used. Copper foils (22, 22) are respectively laminated on first surface (F) and second surface (S) of the insulative substrate.

The insulative substrate is made of resin and reinforcing material, and glass cloth, aramid fiber, glass fiber and the like are listed for such reinforcing material. Epoxy resin, BT (bismaleimide triazine) resin and the like, for example, are listed for resin. Moreover, hydroxide particles may be contained in the resin. Metal hydroxides such as aluminum hydroxide, magnesium hydroxide, calcium hydroxide, barium hydroxide and the like are listed to be used as hydroxide particles. Hydroxides produce water through pyrolysis. Therefore, it is thought that hydroxides can rob heat from the material making core substrate 30. Namely, a hydroxide contained in insulative substrate (30A) is thought to enhance processing results by a laser.

(2) Double-sided copper-clad laminate (30S) is processed and core substrate 30 is completed (FIG. 1(B)). The first surface of the core substrate corresponds to the first surface of the insulative substrate, and the second surface of the core substrate corresponds to the second surface of the insulative substrate. Core substrate 30 may be manufactured by the method described in U.S. Pat. No. 7,786,390. The entire contents of this publication are incorporated herein by reference.

(3) Prepreg containing glass cloth of T-glass, inorganic particles such as silica and thermosetting resin such as epoxy, and metal foil (copper foil) are laminated in that order on first surface (F) of core substrate 30. Prepreg containing glass cloth of E-glass, inorganic particles such as silica particles and thermosetting resin such as epoxy, and metal foil are laminated in that order on second surface (S) of core substrate 30. Then, uppermost interlayer resin insulation layer (50A) and lowermost interlayer resin insulation layer (50B) are formed from the prepreg through thermal pressing. Copper foils 48 are adhered to the interlayer resin insulation layers (FIG. 1(C)).

The thickness of interlayer resin insulation layer (50A) is 30 μm to 50 μm, and the thickness in the present embodiment is set at 35 μm. The thermal expansion coefficient of interlayer resin insulation layer (50A) at 220 degrees is approximately 8.5 ppm. The thickness of interlayer resin insulation layer (50B) is 30 μm to 50 μm, and the thickness in the present embodiment is set at 35 μm. The thermal expansion coefficient of interlayer resin insulation layer (50B) at 220 degrees is approximately 12.1 ppm. Thermal expansion coefficients are controlled by the material and amount of reinforcing material, resin and inorganic particles contained in interlayer resin insulation layers. In the example here, amounts (wt. %) of reinforcing material, inorganic particles and resin are the same in the uppermost and lowermost interlayer resin insulation layers.

(4) Next, using a $CO_2$ gas laser, openings (51A, 51B) for via conductors are respectively formed in interlayer resin insulation layers (50A, 50B) (FIG. 1(D)).

(5) Electroless plated films (52, 52) are formed on copper foils 48 and on the inner walls of openings (51A, 51B) (FIG. 1(E)).

(6) Plating resist 54 is formed on electroless plated film 52 (FIG. 2(A)).

(7) Electrolytic plated film 56 is formed on electroless plated film 52 exposed from plating resist 54 (FIG. 2(B)).

(8) Plating resist 54 is removed. By etching away electroless plated film and metal foil between portions of electrolytic plated film, uppermost and lowermost conductive layers (58A, 58B) along with uppermost and lowermost via conductors (60A, 60B) are formed (FIG. 2(C)). The uppermost and lowermost conductive layers include multiple conductive circuits and via lands around via conductors. Upper and lower buildup layers (55A, 55B) are formed.

(9) Upper solder-resist layer (70A) having openings (71A) is formed on the upper buildup layer, and lower solder-resist layer (70B) having openings (71B) is formed on the lower buildup layer (FIG. 3(A)). Upper surfaces of the uppermost conductive layer and uppermost via conductors exposed through openings (71A) work as C4 pads (IP), and upper surfaces of the lowermost conductive layer and lowermost via conductors exposed through openings (71B) work as BGA pads (MP).

(10) Nickel-plated layer 72 is formed on pads (IP, MP), and gold-plated layer 74 is further formed on nickel-plated layer 72 (FIG. 3(B)). Instead of nickel-gold layers, nickel-palladium-gold layers may also be formed.

(11) After that, solder balls are loaded on pads (IP, MP), and C4 bumps (76U) are formed on C4 pads and BGA bumps (76D) are formed on BGA pads by a reflow process. Printed wiring board 10 is completed (FIG. 7).

Figure 5:
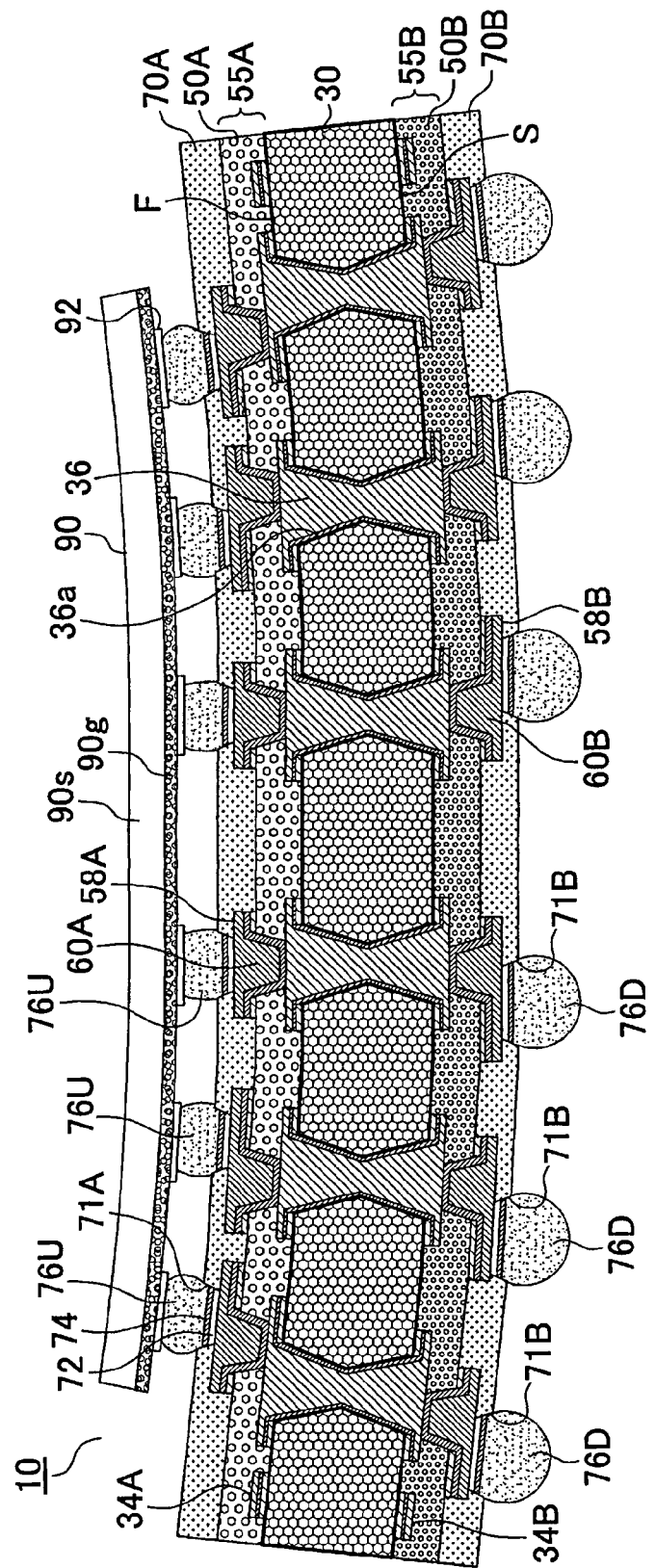
FIG. 5 is a view schematically showing warping of a printed wiring board in the first embodiment at a reflow temperature.

(12) Electrodes 92 of an IC chip are aligned with C4 bumps (76U), and IC chip 90 is mounted on printed wiring board 10 by a reflow process (FIG. 5). As shown in FIG. 5, the printed wiring board warps in the same way as the IC chip at a reflow temperature. Thus, using a printed wiring board of the present embodiment, the mounting yield of an IC chip is enhanced even when the IC chip warps at a reflow temperature. Also, the connection reliability of C4 bumps (76U) is improved.

(13) Then, the printed wiring board is mounted on a motherboard through BGA bumps (76D) (not shown in drawings).

Second Embodiment

Figure 4:
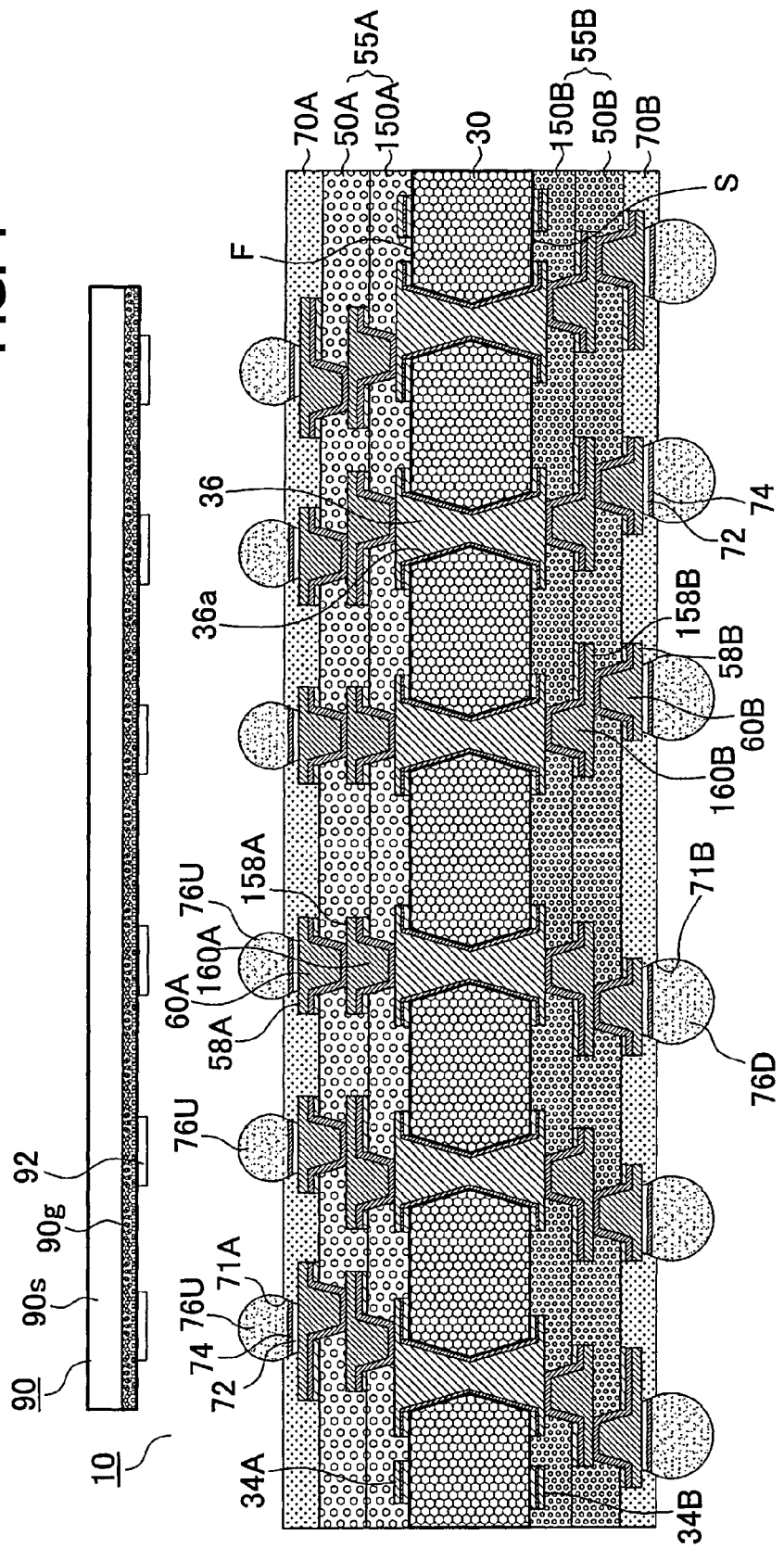
FIG. 4 is a cross-sectional view of an IC chip and a printed wiring board according to a second embodiment.

Printed wiring board 10 of a second embodiment is shown in FIG. 4.

In the first embodiment, the upper and lower buildup layers are single layered. By contrast, the upper and lower buildup layers of a printed wiring board of the second embodiment are double layered. Accordingly, upper interlayer resin insulation layer (150A) is formed on the first surface of the core substrate and on the first conductive layer in the second embodiment. Then, upper conductive layer (158A) is formed on the upper interlayer resin insulation layer, and the upper conductive layer is connected to the first conductive layer and through-hole conductors by upper via conductors (160A) penetrating through the upper interlayer resin insulation layer. Uppermost interlayer resin insulation layer (50A) is formed on the upper interlayer resin insulation layer and upper conductive layer. Uppermost conductive layer (58A) is formed on the uppermost interlayer resin insulation layer, and the uppermost conductive layer is connected to the upper conductive layer and upper via conductors by uppermost via conductors (60A) penetrating through the uppermost interlayer resin insulation layer. Upper buildup layer (55A) is formed with upper and uppermost interlayer resin insulation layers on the core substrate, upper and uppermost conductive layers, and upper and uppermost via conductors.

Also, lower interlayer resin insulation layer (150B) is formed on the second surface of the core substrate and the second conductive layer. Then, lower conductive layer (158B) is formed on the lower interlayer resin insulation layer, and the lower conductive layer is connected to the second conductive layer and through-hole conductors by lower via conductors (160B) penetrating through the lower interlayer resin insulation layer. Lowermost interlayer resin insulation layer (50B) is formed on the lower interlayer resin insulation layer and lower conductive layer. Lowermost conductive layer (58B) is formed on the lowermost interlayer resin insulation layer, and the lowermost conductive layer is connected to the lower conductive layer and lower via conductor by lowermost via conductors (60B) penetrating through the lowermost interlayer resin insulation layer. Lower buildup layer (55B) is formed with lower and lowermost interlayer resin insulation layers on the core substrate, lower and lowermost conductive layers, and lower and lowermost via conductors. Each conductive layer includes multiple conductive circuits and via lands around via conductors.

An upper solder-resist layer having openings (71A) is formed on the upper buildup layer. The uppermost conductive layer and uppermost via conductors exposed through openings (71A) work as C4 pads (IP). A lower solder-resist layer having openings (71B) is formed on the lower buildup layer. The lowermost conductive layer and lowermost via conductors exposed through openings (71B) work as BGA pads (MP). Nickel film 74 and gold film 72 are formed in that order on pads (IP, MP). Then, solder bumps (C4 bumps) (76U) are formed on C4 pads, and solder bumps (BGA bumps) (76D) are formed on BGA pads.

The same as in the first embodiment, the thermal expansion coefficient of the uppermost interlayer resin insulation layer is lower than that of the lowermost interlayer resin insulation layer in a printed wiring board of the second embodiment. A printed wiring board of the second embodiment can also follow the warping of an IC chip at a reflow temperature, the same as in a printed wiring board of the first embodiment. The uppermost and lowermost interlayer resin insulation layers in the second embodiment are the same as the uppermost and lowermost interlayer resin insulation layers in the first embodiment. The contents described in paragraphs 10 through 25 in the first embodiment are applied to a printed wiring board of the second embodiment. In addition, the thickness of a mounted IC chip, the size of the C4 region and the size of a printed wiring board are the same in the first embodiment, the second embodiment and each embodiment and each modified example described later. The printed wiring board of the second embodiment has the same effects as the printed wiring board of the first embodiment.

Method for Manufacturing Printed Wiring Board of the Second Embodiment

A printed wiring board of the second embodiment is manufactured by the same method as in the first embodiment. By repeating twice the steps from the step (3) to the step (8) described above, double-layered buildup layers are formed on the core substrate.

Modified Example 1 of the Second Embodiment

In Modified Example 1 of the second embodiment, upper and lower buildup layers are also double layered, and the thermal expansion coefficient of the uppermost interlayer resin insulation layer is lower than that of the lowermost interlayer resin insulation layer, the same as in the second embodiment. Moreover, the thermal expansion coefficients of the upper and lower interlayer resin insulation layers are the same. In the example here, since upper and lower interlayer resin insulation layers have the same thermal expansion coefficient, even if the buildup layers are double layered, warping of the printed wiring board is controlled by the thermal expansion coefficients of the uppermost and lowermost interlayer resin insulation layers. In Modified Example 1 of the second embodiment, a high-functional IC chip can be mounted on the printed wiring board, and it is relatively easy to control warping.

The contents described in paragraphs 10 through 25 in the first embodiment are applied to the uppermost and lowermost interlayer resin insulation layers of a printed wiring board according to Modified Example 1 of the second embodiment. The printed wiring board in Modified Example 1 of the second embodiment has the same effects as the printed wiring board of the first embodiment. Examples I, II and III of a printed wiring board according to Modified Example 1 of the second embodiment are shown below.

EXAMPLE I

The thermal expansion coefficient of the upper and lower interlayer resin insulation layers is higher than the thermal expansion coefficient of the uppermost interlayer resin insulation layer, and is lower than the thermal expansion coefficient of the lowermost interlayer resin insulation layer. For example, each interlayer resin insulation layer is formed by using the same reinforcing material and resin, and the amount (wt. %) of reinforcing material in the uppermost interlayer resin insulation layer is greater than the amounts in the other interlayer resin insulation layers; the amounts (wt. %) of reinforcing material in the upper and lower interlayer resin insulation layers are the same, and are greater than the amount in the lowermost interlayer resin insulation layer. The film thickness of each interlayer resin insulation layer is substantially the same. In the example here, the thermal expansion coefficient of the uppermost interlayer resin insulation layer is 8 ppm~16 ppm, the thermal expansion coefficient of the upper and lower interlayer resin insulation layers is 12~18 ppm, and the thermal expansion coefficient of the lowermost interlayer resin insulation layer is 15 ppm~22 ppm. The value obtained when the thermal expansion coefficient of the lowermost interlayer resin insulation layer is divided by the thermal expansion coefficient of the upper interlayer resin insulation layer, and the value obtained when the thermal expansion coefficient of the upper interlayer resin insulation layer is divided by the thermal expansion coefficient of the uppermost interlayer resin insulation layer, are 1.05~1.3. Thermal expansion coefficients are preferred to be values at 195 degrees~280 degrees, more preferably, values at 195 degrees~255 degrees. Defects such as warping and connection failure at high temperature are reduced.

Young's moduli of upper and lower interlayer resin insulation layers are preferred to be smaller than Young's modulus of the uppermost interlayer resin insulation layer and greater than Young's modulus of the lowermost interlayer resin insulation layer. Young's modulus of the uppermost interlayer resin insulation layer is 15 GPa to 22 GPa, and Young's modulus of the lowermost interlayer resin insulation layer is 8 GPa to 16 GPa. Then, Young's moduli of the upper and lower interlayer resin insulation layers are 10 GPa to 18 GPa. The value obtained when Young's modulus of the uppermost interlayer resin insulation layer is divided by Young's modulus of the upper interlayer resin insulation layer, and the value obtained when Young's modulus of the upper interlayer resin insulation layer is divided by Young's modulus of the lowermost interlayer resin insulation layer, are preferred to be 1.02~1.6. In the example here, since interlayer resin insulation layers are well balanced on the upper and lower surfaces of the core substrate, defects such as cracks caused by repeated warping occurrences seldom occur in the printed wiring board. Also, connection reliability is secured between the IC chip and the printed wiring board, while cracks are unlikely to occur in interlayer resin insulation layers.

EXAMPLE II

Thermal expansion coefficients are the same in uppermost, upper and lower interlayer resin insulation layers. For example, each interlayer resin insulation layer is formed by using the same reinforcing material and resin, the amounts (wt. %) of reinforcing material in the uppermost, upper and lower interlayer resin insulation layers are the same, and are greater than the amount of reinforcing material in the lowermost interlayer resin insulation layer. The film thickness of each interlayer resin insulation layer is substantially the same. For example, glass cloth in the uppermost, upper and lower interlayer resin insulation layers is made of T-glass, and glass cloth in the lowermost interlayer resin insulation layer is made of E-glass. Alternatively, all the interlayer resin insulation layers contain glass cloth made of T-glass, and the amounts (wt. %) of resin contained in the uppermost, upper and lower interlayer resin insulation layers are less than the amount (wt. %) of resin contained in the lowermost interlayer resin insulation layer.

In the example here, the thermal expansion coefficient of the uppermost interlayer resin insulation layer is 8 ppm~20 ppm, and the thermal expansion coefficient of the lowermost interlayer resin insulation layer is 15 ppm to 22 ppm. Thermal expansion coefficients are preferred to be values at 195 degrees~280 degrees, more preferably values at 195 degrees~255 degrees. Defects such as warping and connection failure at high temperatures are reduced. Young's modulus of the lowermost interlayer resin insulation layer is 8 GPa~16 GPa. Young's moduli of the upper and lower interlayer resin insulation layers are 13 GPa~22 GPa, the same as Young's modulus of the uppermost interlayer resin insulation layer described in the first embodiment. Connection reliability is secured between the IC chip and printed wiring board, while cracks are unlikely to occur in the interlayer resin insulation layers.

EXAMPLE III

Thermal expansion coefficients of the lowermost, upper and lower interlayer resin insulation layers are the same. For example, each interlayer resin insulation layer is formed by using the same reinforcing material and resin, the amount (wt. %) of reinforcing material in the uppermost interlayer resin insulation layer is greater than the amounts in the other interlayer resin insulation layers, and the amounts (wt. %) of reinforcing material in the upper, lower and lowermost interlayer resin insulation layers are the same. The film thickness of each interlayer resin insulation layer is substantially the same. For example, glass cloth in the lowermost, upper and lower interlayer resin insulation layers is made of E-glass, and glass cloth in the uppermost interlayer resin insulation layer is made of T-glass. Alternatively, all the interlayer resin insulation layers contain glass cloth made of T-glass, and the amounts (wt. %) of resin contained in the lowermost, upper and lower interlayer resin insulation layers are greater than the amount (wt. %) of resin contained in the uppermost interlayer resin insulation layer.

In the example here, the thermal expansion coefficient of the uppermost interlayer resin insulation layer is 8 ppm~20 ppm, and the thermal expansion coefficient of the lowermost interlayer resin insulation layer is 15 ppm to 22 ppm. Thermal expansion coefficients are preferred to be values at 195 degrees ~280 degrees, more preferably values at 195 degrees~255 degrees. Defects such as warping and connection failure at high temperatures are reduced. Young's moduli of the upper and lower interlayer resin insulation layers are 8 PGa to 16 GPa, the same as Young's modulus of the lowermost interlayer resin insulation layer described in the first embodiment. Young's modulus of the uppermost resin insulation layer is 13 GPa to 22 GPa. Connection reliability is secured between the IC chip and printed wiring board, while cracks are unlikely to occur in the interlayer resin insulation layers.

When printed wiring boards in Examples II and III above are compared, the thermal expansion coefficient of a printed wiring board in Example II is lower than that of a printed wiring board in Example III. Accordingly, using a printed wiring board in Example II, C4 bumps are seldom damaged in heat cycles during use. Also, the amount of warping of a printed wiring board at room temperature is small. When printed wiring boards in Examples II and III above are compared, the thermal expansion coefficient of a printed wiring board in Example III is greater than that of a printed wiring board in Example II. Accordingly, using a printed wiring board in Example III, BGA bumps are seldom damaged in heat cycles during use.

Modified Example 2 of the Second Embodiment In Modified Example 2 of the second embodiment, upper and lower buildup layers are also double layered, the same as in the second embodiment. The thermal expansion coefficient of the uppermost interlayer resin insulation layer is lower than that of the lowermost interlayer resin insulation layer. Moreover, the thermal expansion coefficient of each interlayer resin insulation layer changes from the uppermost interlayer resin insulation layer toward the lowermost interlayer resin insulation layer. In the example here, the difference is greater between the thermal expansion coefficient in the upper buildup layer and the thermal expansion coefficient in the lower buildup layer. Thus, when a printed wiring board of the first embodiment is compared with a printed wiring board in Modified Example 2 of the second embodiment, the amount of warping at a mounting temperature of the printed wiring board in Modified Example 2 of the second embodiment is generally great. The printed wiring board in Modified Example 2 of the second embodiment is suitable for a printed wiring board for mounting an IC chip with a greater amount of warping. The contents described in paragraphs 10 through 25 in the first embodiment can be applied to the uppermost and lowermost interlayer resin insulation layers of the printed wiring board in Modified Example 2 of the second embodiment.

The printed wiring board in Modified Example 2 of the second embodiment has the same effects as the printed wiring board in the first embodiment. Examples IV and V of a printed wiring board according to Modified Example 2 of the second embodiment are listed below.

EXAMPLE IV

The thermal expansion coefficient of the uppermost interlayer resin insulation layer is lower than that of the upper interlayer resin insulation layer, the thermal expansion coefficient of the upper interlayer resin insulation layer is lower than that of the lower interlayer resin insulation layer, and the thermal expansion coefficient of the lower interlayer resin insulation layer is lower than that of the lowermost interlayer resin insulation layer. Thermal expansion coefficients of interlayer resin insulation layers change in due order.

For example, each interlayer resin insulation layer is formed by using the same reinforcing material and resin, the amount (wt. %) of reinforcing material in the uppermost interlayer resin insulation layer is greater than in the other interlayer resin insulation layers, the amount (wt. %) of reinforcing material of the upper interlayer resin insulation layer is greater than the amounts (wt. %) of reinforcing material in the lower and lowermost interlayer resin insulation layers, and the amount (wt. %) of reinforcing material in the lower interlayer resin insulation layer is greater than in the lowermost interlayer resin insulation layer. For example, glass cloth in the lowermost and lower interlayer resin insulation layers is made of E-glass, and glass cloth in the uppermost and upper interlayer resin insulation layers is made of T-glass. Then, the amounts (wt. %) of resin contained in the uppermost and upper interlayer resin insulation layers are different, and the amounts (wt. %) of resin contained in the lowermost and lower interlayer resin insulation layers are different. Alternatively, all the interlayer resin insulation layers contain glass cloth made of T-glass, and the amounts (wt. %) of resin contained in interlayer resin insulation layers increase from the uppermost interlayer resin insulation layer toward the lowermost resin insulation layer. In the example here, since the thermal expansion coefficient of each interlayer resin insulation layer changes in due order, stress from warping seldom concentrates in a particular interlayer resin insulation layer. Accordingly, even when the amount of warping is great, cracks seldom occur in interlayer resin insulation layers.

When YU is in the above range, Young's modulus of the upper interlayer insulation layer is preferred to be greater than that of the lower interlayer resin insulation layer. Variations in warping of printed wiring boards are reduced.

YU is preferred to be in the above range, and the value (YL), obtained when Young's modulus of upper interlayer resin insulation layer (150A) is divided by Young's modulus of lower interlayer resin insulation layer (150B), is preferred to be 1.05 to 2. Even when the amount of warping of a printed wiring board is great, cracks are unlikely to occur in the printed wiring board. Furthermore, YL is preferred to be 1.6 or smaller. The connection reliability between an IC chip and a printed wiring board is secured while cracks are prevented from occurring in interlayer resin insulation layers. EU is preferred to be in the above range, and the value (EL) obtained when Young's modulus of reinforcing material such as glass cloth contained in the upper interlayer resin insulation layer is divided by Young's modulus of reinforcing material contained in the lower interlayer resin insulation layer is preferred to be 1.05 or greater but 1.2 or smaller. Cracks are unlikely to occur in upper and lower buildup layers.

EXAMPLE V

The thermal expansion coefficient of the uppermost interlayer resin insulation layer is the same as that of the upper interlayer resin insulation layer, and the thermal expansion coefficient of the lower interlayer resin insulation layer is the same as that of the lowermost interlayer resin insulation layer. Thermal expansion coefficients of interlayer resin insulation layers change in stages. For example, each interlayer resin insulation layer is formed by using the same reinforcing material and resin, the amounts (wt. %) of reinforcing material in the uppermost and upper interlayer resin insulation layers are the same, and the amounts (wt. %) of reinforcing material in the lower and lowermost interlayer resin insulation layers are the same. Then, the amount (wt. %) of reinforcing material in the uppermost interlayer resin insulation layer is greater than that of reinforcing material in the lowermost interlayer resin insulation layer. For example, glass cloth in the lowermost and lower interlayer resin insulation layers is made of E-glass, and glass cloth in the uppermost and upper interlayer resin insulation layers is made of T-glass. Alternatively, all the interlayer resin insulation layers contain glass cloth made of T-glass, and the amounts (wt. %) of resin contained in the lowermost and lower interlayer resin insulation layers are greater than the amounts (wt. %) of resin contained in the uppermost and upper interlayer resin insulation layers.

In the example here, the thermal expansion coefficient of the uppermost interlayer resin insulation layer is 8 ppm~16 ppm, and the thermal expansion coefficient of the lowermost interlayer resin insulation layer is 15 ppm~22 ppm. In the example here, thermal expansion coefficients are the same in the upper and uppermost interlayer resin insulation layers, and thermal expansion coefficients are the same in the lower and lowermost interlayer resin insulation layers. Therefore, delamination of interlayer resin insulation layers seldom occurs in the upper and lower buildup layers. When YU is in the above range, the value (YL) obtained when Young's modulus of upper interlayer resin insulation layer (150A) is divided by Young's modulus of lower interlayer resin insulation layer (150B) is preferred to be 1.05 to 2. Even when the amount of warping of a printed wiring board is great, cracks are unlikely to occur in the printed wiring board. Young's modulus of the upper interlayer resin insulation layer is 13 GPa to 22 GPa, and Young's modulus of the lower interlayer resin insulation layer is 8 GPa to 16 GPa. In this example, warping of the printed wiring board is great, but cracks are unlikely to occur in each interlayer resin insulation layer.

Young's modulus in the upper interlayer resin insulation layer is preferred to be greater than that of the lower interlayer resin insulation layer, and be 15 GPa or greater.

The amount of warping during a reflow process in a printed wiring board according to Modified Example 2 of the second embodiment is greater than those of a printed wiring board in the first embodiment, a printed wiring board in the second embodiment and a printed wiring board in Modified Example 1 of the second embodiment. Therefore, the printed wiring board in Modified Example 2 of the second embodiment is suitable as a printed wiring board for mounting an IC chip with a thickness of 0.05 mm to 0.1 mm. Then, the printed wiring board of the first embodiment, the printed wiring board of the second embodiment, and the printed wiring board in Modified Example 1 of the second embodiment are suitable to be used as a printed wiring board for mounting an IC chip with a thickness of 0.1 mm to 0.15 mm.

In Modified Example 2 of the second embodiment, the value (PL), obtained when the thermal expansion coefficient of the lower interlayer resin insulation layer is divided by that of the upper interlayer resin insulation layer, is preferred to be within a predetermined range. Variations in the amounts of warping become smaller. PL is preferred to be a value at a reflow temperature. The reflow temperature is 220 degrees, for example. It is preferred that PU be in the above range and that PL be greater than 1 but smaller than 1.5. Even when the size of a printed wiring board is great, the mounting yield of an IC chip is improved. Moreover, PL is preferred to be greater than 1.1 but smaller than 1.5. Even when the size of a printed wiring board is great, connection reliability is enhanced between the printed wiring board and an IC chip. The length of a side of a printed wiring board in Modified Example 2 of the second embodiment is 18 mm or greater but 25 mm or less, for example. Even when the size of a printed wiring board is great, the printed wiring board can follow the warping of an IC chip. In addition, when PU and PL are within the above ranges, even when an IC chip with a thickness of 0.05 mm to 0.1 mm is mounted on a printed wiring board, connection reliability is high between the printed wiring board and the IC chip.

In Modified Example 2 of the second embodiment, the thermal expansion coefficient of the upper interlayer resin insulation layer at 220° C. is preferred to be 16 ppm or lower. Connection failure seldom occurs between the printed wiring board and the IC chip while in use.

In Modified Example 2 of the second embodiment, to set PL within the above range, the value (GL), obtained when the thermal expansion coefficient of the reinforcing material in the lower interlayer resin insulation layer is divided by the thermal expansion coefficient of the reinforcing material in the upper interlayer resin insulation layer, is preferred to be 1.5 or higher but 2.5 or lower. If GL is in such a range, the strength of interlayer resin insulation layers is enhanced. Even when a printed wiring board warps, cracks seldom occur in interlayer resin insulation layers.

First Example

FIG. 4 is a cross-sectional view of a printed wiring board of a first example.

In a printed wiring board in the first example, uppermost interlayer resin insulation layer (50A) contains glass cloth made of T-glass. The other interlayer resin insulation layers (upper interlayer resin insulation layer, lowermost interlayer resin insulation layer, lower interlayer resin insulation layer) contain glass cloth made of E-glass. The thermal expansion coefficient of the uppermost interlayer resin insulation layer is approximately 8.5 ppm, and the thermal expansion coefficients of the other interlayer resin insulation layers (upper interlayer resin insulation layer, lowermost interlayer resin insulation layer, lower interlayer resin insulation layer) are approximately 12.1 ppm.

The CTE of the uppermost interlayer resin insulation layer is lower than those of the other interlayer resin insulation layers (upper interlayer resin insulation layer, lowermost interlayer resin insulation layer, lower interlayer resin insulation layer).

Second Example

A printed wiring board according to a second example is shown in FIG. 7. The printed wiring board of the second example has single-layered upper and lower buildup layers. The uppermost interlayer resin insulation layer and the lowermost interlayer resin insulation layer contain glass cloth of the same type. The glass cloth in the second example is made of T-glass. Thicknesses of the uppermost and lowermost interlayer resin insulation layers are the same: 35 μm. The amount (wt. %) of resin contained in the uppermost interlayer resin insulation layer is less than that of resin contained in the lowermost interlayer resin insulation layer. The amount of reinforcing material contained in the uppermost interlayer resin insulation layer is greater than the amount of reinforcing material contained in the lowermost interlayer resin insulation layer. Therefore, the thermal expansion coefficient of the uppermost interlayer resin insulation layer is lower than that of the lowermost interlayer resin insulation layer. In addition, Young's modulus of the uppermost interlayer resin insulation layer is greater than that of the lowermost interlayer resin insulation layer.

In the second example, the amount of resin in the uppermost interlayer resin insulation layer is approximately 67 wt. %, and the amount of resin in the lowermost interlayer resin insulation layer is approximately 73 wt. %. At 220 degrees, the CTE of the uppermost interlayer resin insulation layer is approximately 9 ppm, and the CTE of the lowermost interlayer resin insulation layer is approximately 13 ppm. At 260 degrees, Young's modulus of the uppermost interlayer resin insulation layer is approximately 19 GPa, and Young's modulus of the lowermost interlayer resin insulation layer is approximately 15 GPa.

Third Embodiment

Figure 9:
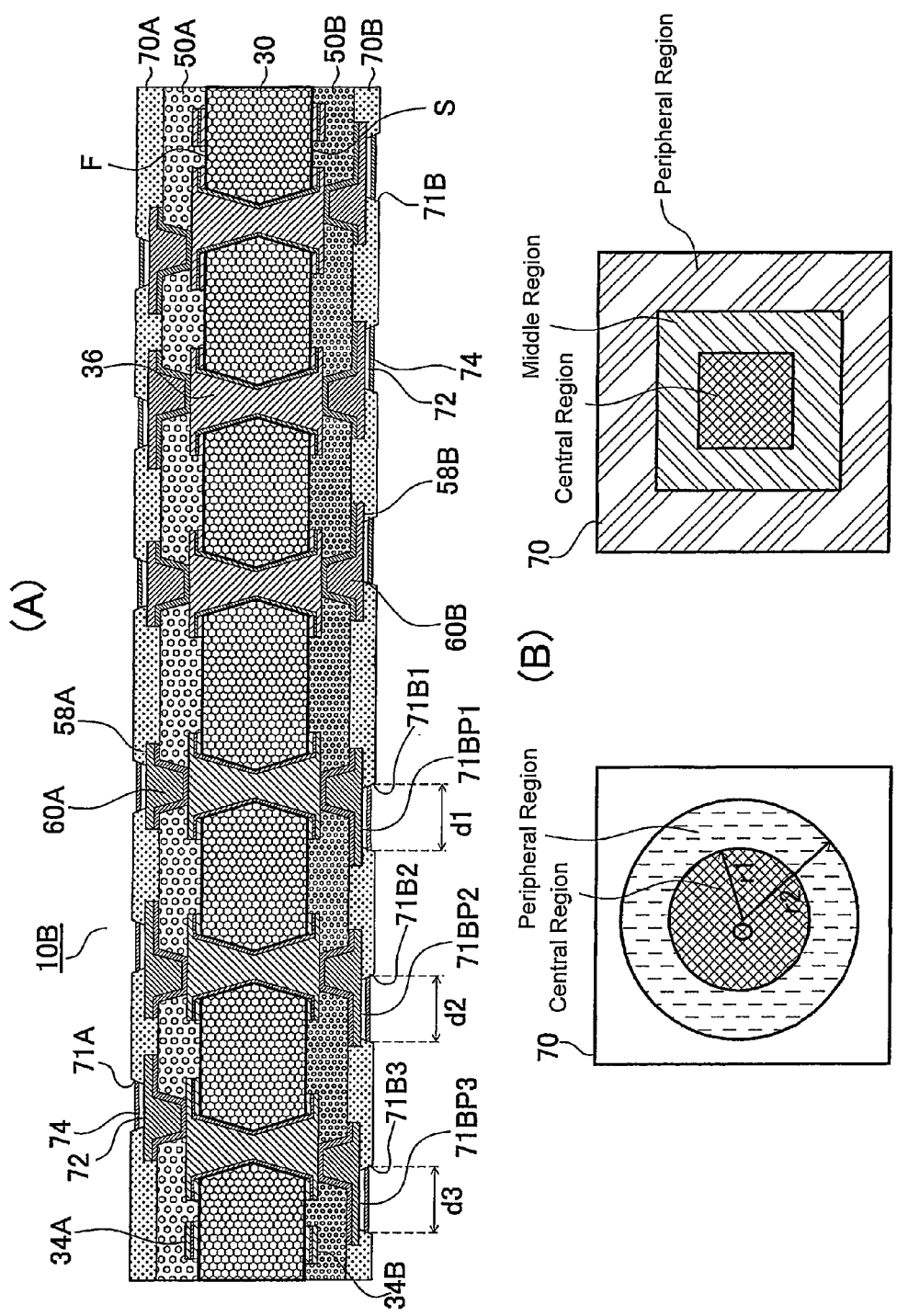
FIG. 9(A) is a view showing openings in a lower solder-resist layer of a printed wiring board according to the third embodiment.
FIG. 9(B) is plan views of the lower solder-resist layer.

FIG. 9(A) shows printed wiring board (10B) having solder-resist layers. The core substrate and upper and lower buildup layers of printed wiring board (10B) are the same as those in the first embodiment.

Openings (71B) with different sizes are formed in lower solder-resist layer (70B). The sizes of openings (71B)

decrease from the center of the printed wiring board toward the periphery. The sizes of BGA pads decrease from the center of the printed wiring board toward the periphery. The printed wiring board in the third embodiment has three different openings (71B1, 71B2, 71B3). Openings (first openings) (71B1), openings (second openings) (71B2) and openings (third openings) (72B3) have different sizes; the size of openings (71B1) is greater than the size of openings (71B2), and the size of openings (71B2) is greater than the size of openings (71B3). Openings (71B1) are formed in the central region of the printed wiring board, openings (71B3) are formed in the peripheral region of the printed wiring board, and openings (71B2) are formed in the middle region between the central region and the peripheral region. Since BGA pads are portions exposed from openings (71B), the printed wiring board of the third embodiment has BGA pads with different sizes. BGA pads are divided into multiple regions, and the size of BGA pads in their respective regions is the same. FIG. 9(B) is a plan view of the lower solder-resist layer. BGA pad (71BP) is shown in the drawing. BGA pads are divided into multiple regions.

In the third embodiment, size (d1) of openings (71B1) is 250 μm, size (d2) of openings (71B2) is 240 μm, and size (d3) of openings (71B3) is 230 μm. In adjacent regions, the sizes of openings are different by 7 μm to 15 μm. In the third embodiment, the sizes of openings are different by 10 μm in adjacent regions. BGA pads become smaller in stages or gradually become smaller from the center of the printed wiring board toward the periphery.

Figure 10:
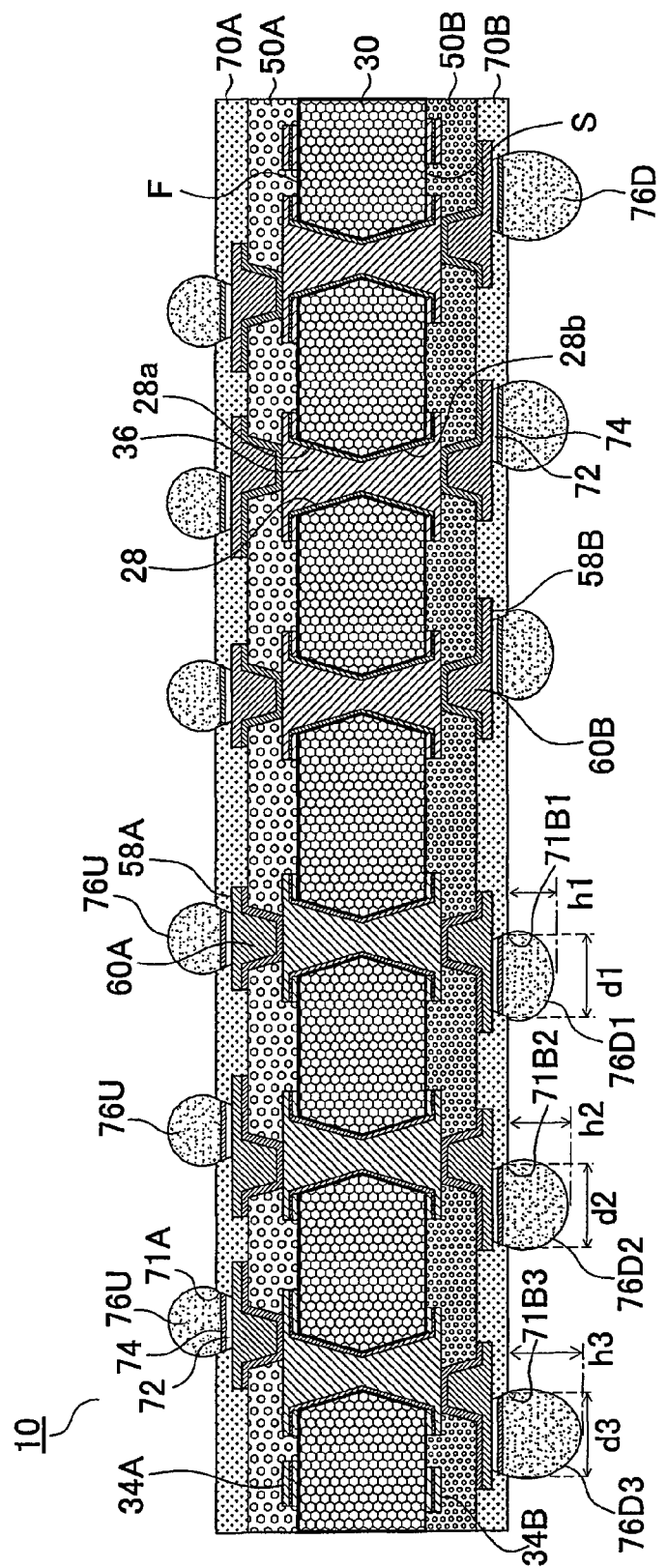
FIG. 10 is a cross-sectional view of a printed wiring board with solder bumps according to the third embodiment.

C4 bumps and BGA bumps are formed in the printed wiring board shown in FIG. 9(A) (FIG. 10). Since the sizes of BGA pads are different and the volumes of BGA bumps (76D) are the same, the heights of BGA bumps are different. The heights of BGA bumps increase from the center of the printed wiring board toward the periphery. The heights of BGA bumps increase in stages from the central region toward the peripheral region. The conductors exposed from openings (71B1) are first BGA pads (71BP1), the conductors exposed from openings (71B2) are second BGA pads (71BP2), and the conductors exposed from openings (71B3) are third BGA pads (71BP3).

In the third embodiment, height (h1) of BGA bumps (first BGA bumps) (76D1) on first BGA pads is 130 height (h2) of BGA bumps (second BGA bumps) (76D2) on second BGA pads is 140 μm, and height (h3) of BGA bumps (third BGA bumps) (76D3) on third BGA pads is 150 μm (FIG. 10).

Figure 11:
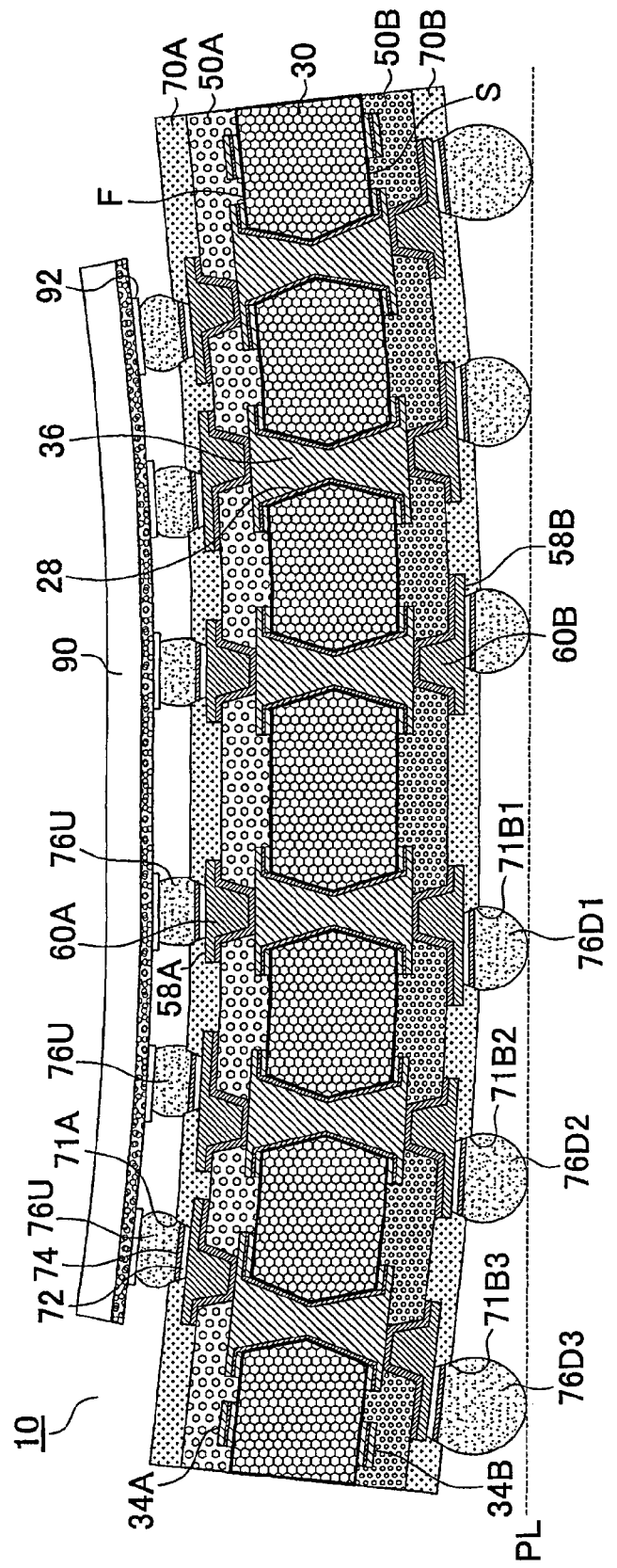
FIG. 11 is a view schematically showing warping of a printed wiring board in the third embodiment during a second mounting.

IC chip 90 is mounted on printed wiring board 10 of the third embodiment, and a semiconductor device is completed. The semiconductor device is mounted on a motherboard through a reflow process. Such a mounting is referred to as a second mounting. In each embodiment and each modified example, since the CTE of an upper buildup layer is lower than the CTE of a lower buildup layer, a semiconductor device tends to warp as shown in FIG. 11 during the second mounting. When a semiconductor device is placed on a flat board with the IC chip facing upward, the printed wiring board tends to warp in such a way that the periphery of the printed wiring board is elevated off the board. Connection failure tends to occur between the motherboard and the semiconductor element. Connection reliability is lowered between the motherboard and the semiconductor element. However, in the third embodiment, since the heights of BGA bumps increase from the center of the printed wiring board toward the periphery, even if the semiconductor device warps as shown in FIG. 11, the peaks of BGA bumps are positioned on substantially the same plane (PL).

Figure 12:
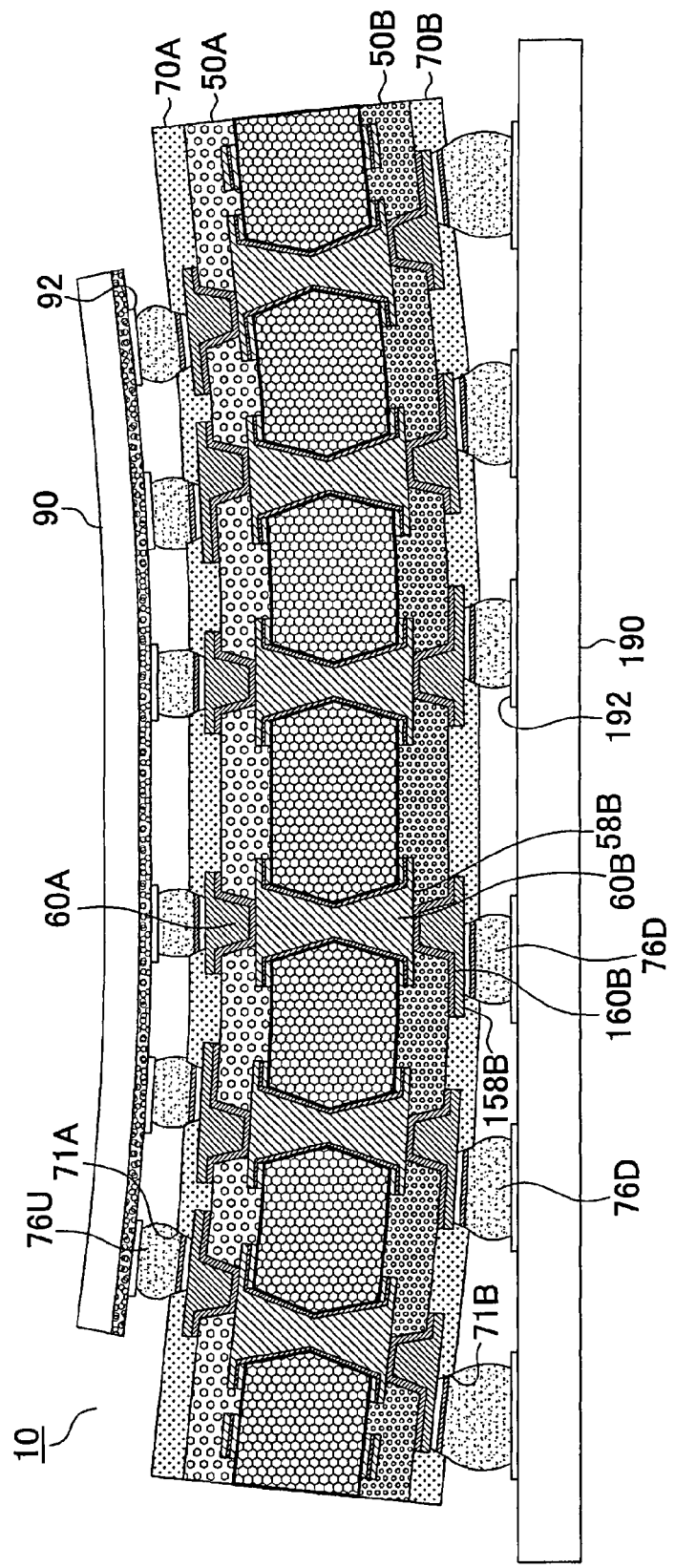
FIG. 12 is a view showing the connection between a motherboard and a printed wiring board of the third embodiment during a second mounting.

FIG. 12 schematically shows the state of a second mounting. In FIG. 12, printed wiring board 10 is mounted on motherboard 190. Since peaks of BGA bumps are positioned on substantially the same plane in the third embodiment, a printed wiring board of the third embodiment can be mounted on a flat motherboard even when the printed wiring board is warped. The reliability of connections between the motherboard and the printed wiring board through BGA bumps is improved. The mounting yield of a semiconductor device is improved.

FIG. 8 shows a method for manufacturing a printed wiring board of the third embodiment. A core substrate and upper and lower buildup layers on the core substrate are formed the same as in the first embodiment (FIG. 2(C)).

Commercially available solder-resist films (70α, 70β) are formed on upper and lower buildup layers. For example, such films are sold by Hitachi Chemical Co., Ltd. Solder-resist film (70α) is an upper solder-resist film and solder-resist film (70β) is a lower solder-resist film (FIG. 8(A)). An exposure treatment, developing treatment and curing treatment are conducted on solder-resist films (70α, 70β) so that solder-resist layers having openings (71A, 71B) are formed (FIG. 8(B)). During the exposure treatment, exposure mask 18 is aligned on solder-resist film (70β), and solder-resist film (70β) is exposed to light through the exposure mask. Exposure mask 18 has shading portions. The sizes of such shading portions decrease from the center of the exposure mask toward its periphery. Accordingly, the sizes of BGA pads decrease from the center of the printed wiring board toward the periphery. On the other hand, solder-resist film (70α) is exposed to light through an exposure mask having shading portions of the same size. Accordingly, the size of each C4 pad is the same. In the third embodiment, BGA pads are divided into three regions (central region, middle region, peripheral region). The size of first BGA pads is 250 μm, the size of second BGA pads is 240 μm, and the size of third BGA pads is 230 μm.

Then, nickel-plated layer 72 is formed on C4 pads and BGA pads, the same as in the first embodiment, and gold-plated layer 74 is further formed on nickel-plated layer 72 (FIG. 8(B)).

C4 bumps and BGA bumps are formed on pads, the same as in the first embodiment. Each C4 bump has the same volume, and each BGA bump has the same volume. The height of each C4 bump is substantially the same, while the heights of BGA bumps increase from the center of a printed wiring board toward the periphery.

An IC chip is mounted on a printed wiring board through C4 bumps (FIG. 11). A semiconductor device formed with an IC chip and a printed wiring board is completed.

Then, the semiconductor device is mounted on motherboard 190 by a reflow process (FIG. 12). The semiconductor device warps at a reflow temperature as shown in FIG. 11. However, since heights of BGA bumps are set to follow warping of a semiconductor device in the third embodiment, a warped semiconductor device is mounted on a flat motherboard at a high yield rate. Since motherboards are thick, they seldom warp at a reflow temperature. In the third embodiment, even if a printed wiring board warps, since peaks of BGA bumps (76D1, 76D2, 76D3) are positioned on substantially the same plane, a warped printed wiring board and a flat motherboard are securely connected. Connection reliability of BGA bumps is improved, and the yield in the step for mounting the printed wiring board on a motherboard is enhanced.

C4 bumps and BGA bumps of each embodiment are made of solder. The contents described in the first embodiment, the second embodiment, and each modified example of the second embodiment can be applied to the third embodiment.

Fourth Embodiment

Figure 13:
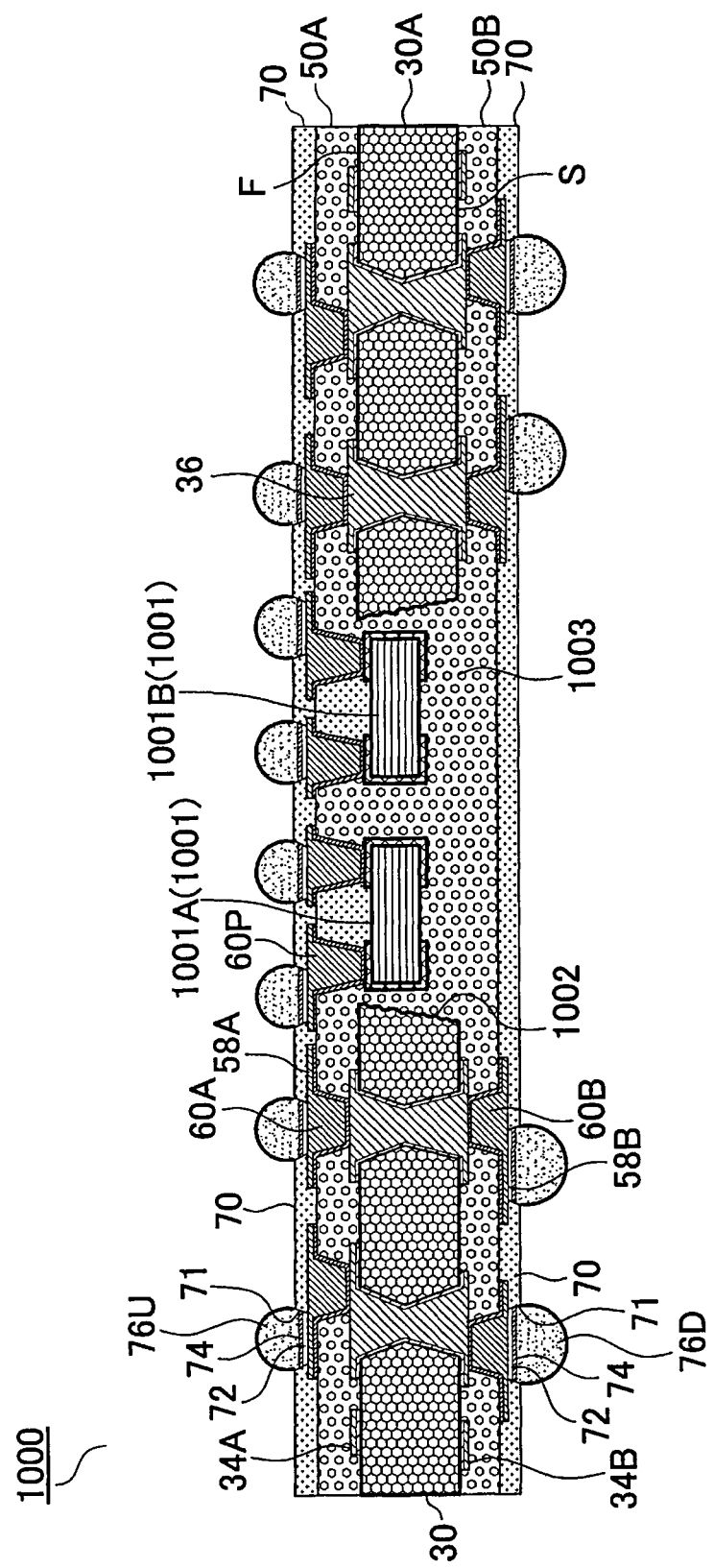
FIG. 13 is a cross-sectional view of a printed wiring board according to a fourth embodiment.

FIG. 13 shows printed wiring board 1000 according to a fourth embodiment. The core substrate of a printed wiring board in the fourth embodiment is substantially the same as that in the first embodiment, but it further includes cavity 1002 to accommodate electronic component 1001 such as a chip capacitor. Cavity 1002 is preferred to be an opening that reaches a second surface of an insulative base from its first surface. A printed wiring board of the fourth embodiment is substantially the same as a printed wiring board of the first embodiment, but it further contains an electronic component in a cavity of the core substrate. In a printed wiring board of the fourth embodiment, filler 1003 is formed between the electronic component and the core substrate. Since a cavity is formed in the core substrate of the fourth embodiment, the strength of the core substrate is weak. Therefore, a printed wiring board of the fourth embodiment tends to warp during a first mounting and a second mounting. To control the direction of warping in a printed wiring board, the thermal expansion coefficient of the uppermost interlayer resin insulation layer of the printed wiring board is set lower than that of the lowermost interlayer resin insulation layer in the fourth embodiment. Since the core substrate has a cavity in the fourth embodiment, the amount of warping of a printed wiring board in the fourth embodiment tends to be great. During a first mounting, an IC chip is mounted on a printed wiring board by a reflow process. The yield of a second mounting is enhanced when a method, in which the sizes of BGA pads decrease from the center toward the periphery of a printed wiring board as shown in the third embodiment, is applied to a printed wiring board of the fourth embodiment. Connection reliability is enhanced between a motherboard and a printed wiring board. In the same manner, the yield of a second mounting is enhanced when a method, in which the sizes of BGA pads decrease from the center toward the periphery of a printed wiring board as shown in the third embodiment, is applied to the first embodiment, the second embodiment, and each modified example of the second embodiment.

Multiple electronic components (1001A, 1001B) are accommodated in one cavity 1002 in FIG. 13. Two electronic components are accommodated in one cavity in FIG. 13. When multiple electronic components are accommodated in one cavity, the size of the cavity increases. Thus, it is effective to decrease the size of BGA pads from the center of the printed wiring board toward the periphery. FIG. 14 shows the shape of a cavity for accommodating two electronic components in one cavity. In FIG. 14(A), parts of multiple accommodation portions (1002A, 1002B) overlap to form one cavity 1002. The length of overlapping parts is shorter than the length of electronic components. The electronic components seldom touch each other. One electronic component is accommodated in each accommodation portion. FIG. 14(B) is a plan view, showing a first surface of a core substrate, cavity 1002 and electronic components in the cavity. FIG. 14(C) is a perspective view of FIG. 14(B). Partitions 1004 are formed in one cavity in FIG. 14(B). Electronic components are prevented from touching each other by partitions 1004. Distance (SK) between partitions is shorter than length (SK2) of electronic components.

Figure 15:
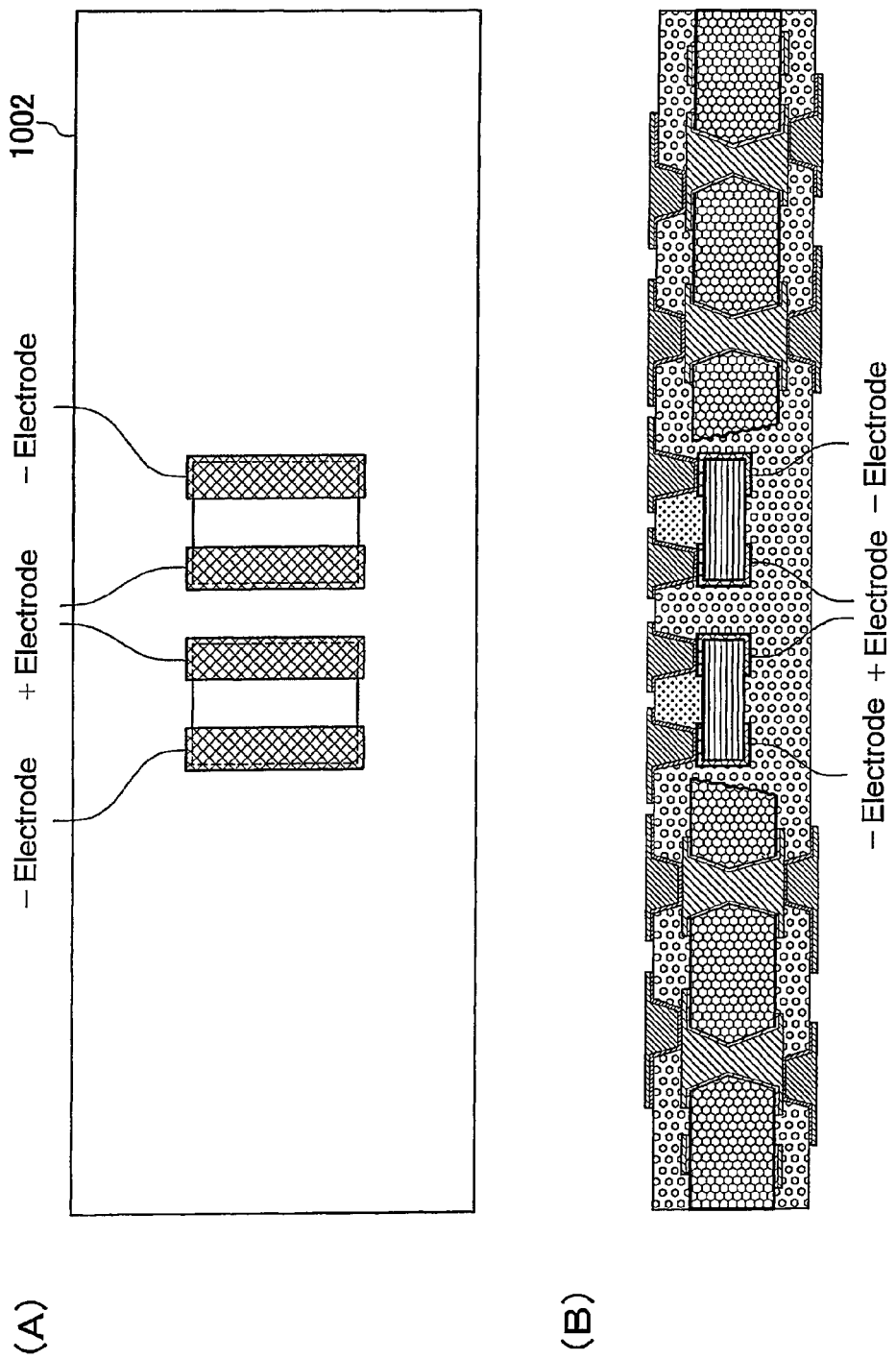
FIGS. 15(A)-15(B) are views showing a cross-sectional view of a printed wiring board and electronic components in its cavity according to the fourth embodiment.

FIG. 15 shows an example in which multiple chip capacitors are accommodated in one cavity. In FIG. 15, electrodes with the same polarity of adjacent chip capacitors face each other. In the example here, a plus electrode faces a plus electrode. Even if they touch each other, short circuiting does not occur. When a printed wiring board has a cavity for accommodating electronic components, the size of such a cavity can be reduced by designing as shown in FIGS. 14 and 15. Accordingly, by decreasing the size of BGA pads from the center of a printed wiring board toward the periphery, connection reliability is enhanced between a printed wiring board of the fourth embodiment and a motherboard. Also, it is easy to control warping during mounting procedures by adjusting thermal expansion coefficients of the uppermost and lowermost interlayer resin insulation layers.

In the first embodiment, second embodiment, each modified example of the second embodiment, third embodiment and fourth embodiment, it is preferred to divide BGA pads into multiple regions in a printed wiring board. The yield of a second mounting is improved. In each embodiment and each modified example, all the interlayer resin insulation layers are preferred to contain glass cloth made of T-glass. Then, it is preferred that interlayer resin insulation layers having different thermal expansion coefficients contain different amounts (wt. %) of resin. To set different thermal expansion coefficients in interlayer resin insulation layers containing the same glass cloth by adjusting the amount (wt. %) of resin, the difference in the amounts of resin is 4 wt. % to 13 wt. %. Since each interlayer resin insulation layer contains the same reinforcing material, cracking is unlikely to occur in interlayer resin insulation layers. An electronic component can be built into the cavity of a core substrate in a printed wiring board according to each embodiment and each modified example described above. Without being bound by the theory, when a core substrate has a cavity, and the thermal expansion coefficient of an uppermost interlayer resin insulation layer is lower than that of a lowermost interlayer resin insulation layer, warping of a printed wiring board is thought to be great during mounting procedures. The first embodiment, second embodiment, each modified example of the second embodiment, and third embodiment are effectively applied to a printed wiring board with a built-in electronic component.

A printed wiring board according to an embodiment of the present invention has the following: a core substrate formed with an insulative substrate having a first surface and a second surface opposite the first surface, a first conductive layer formed on the first surface of the insulative substrate, a second conductive layer formed on the second surface of the insulative substrate, and a through-hole conductor penetrating through the insulative substrate and connecting the first conductive layer and the second conductive layer; an upper buildup layer made up of an uppermost interlayer resin insulation layer laminated on the first surface of the insulative substrate and on the first conductive layer, an uppermost conductive layer formed on the uppermost interlayer resin insulation layer, and an uppermost via conductor penetrating through the uppermost interlayer resin insulation layer and connecting the uppermost conductive layer with the through-hole conductor or the first conductive layer; and a lower buildup layer made up of a lowermost interlayer resin insulation layer laminated on the second surface of the insulative substrate and on the second conductive layer, a lowermost conductive layer formed on the lowermost interlayer resin insulation layer, and a lowermost via conductor penetrating through the lowermost interlayer resin insulation layer and connecting the lowermost conductive layer with the through-hole conductor or the second conductive layer. In such a printed wiring board, the thermal expansion coefficient of the uppermost interlayer resin insulation layer is set lower than that of the lowermost interlayer resin insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate having a first surface and a second surface on an opposite side of the first surface;
   a first buildup layer laminated on the first surface of the core substrate and comprising an outermost interlayer resin insulation layer and an outermost conductive layer formed on the outermost interlayer resin insulation layer of the first buildup layer; and
   a second buildup layer laminated on the second surface of the core substrate and comprising an outermost interlayer resin insulation layer and an outermost conductive layer formed on the outermost interlayer resin insulation layer of the second buildup layer,
   wherein the outermost conductive layer of the first buildup layer includes a plurality of pads positioned to mount a semiconductor device on a surface of the first buildup layer, and the outermost interlayer resin insulation layer of the first buildup layer has a thermal expansion coefficient which is set lower than a thermal expansion coefficient of the outermost interlayer resin insulation layer of the second buildup layer.

2. The printed wiring board according to claim 1, wherein the core substrate includes an insulative substrate, a first conductive layer formed on a first surface of the insulative substrate, a second conductive layer formed on a second surface of the insulative substrate and a through-hole conductor penetrating through the insulative substrate and connecting the first conductive layer and the second conductive layer, the first buildup layer is laminated on the first surface of the insulative substrate and the first conductive layer, and the second buildup layer is laminated on the second surface of the insulative substrate and the second conductive layer.

3. The printed wiring board according to claim 2, wherein the first buildup layer has a via conductor penetrating through the outermost interlayer resin insulation layer of the first buildup layer and connecting the outermost conductive layer of the first buildup layer and one of the through-hole conductor and the first conductive layer.

4. The printed wiring board according to claim 2, wherein the first buildup layer has a via conductor penetrating through the outermost interlayer resin insulation layer of the first buildup layer and connecting the outermost conductive layer of the first buildup layer and one of the through-hole conductor and the first conductive layer, and the second buildup layer has a via conductor penetrating through the outermost interlayer resin insulation layer of the second buildup layer and connecting the outermost conductive layer of the second buildup layer and one of the through-hole conductor and the second conductive layer.

5. The printed wiring board according to claim 2, wherein the first buildup layer includes a plurality of interlayer resin insulation layers including the outermost interlayer resin insulation layer of the first buildup layer, and the first buildup layer has a plurality of via conductors penetrating though the plurality of interlayer resin insulation layers, respectively, and connecting the outermost conductive layer of the first buildup layer and one of the through-hole conductor and the first conductive layer.

6. The printed wiring board according to claim 2, wherein the first buildup layer includes a plurality of interlayer resin insulation layers including the outermost interlayer resin insulation layer, the first buildup layer has a plurality of via conductors penetrating though the plurality of interlayer resin insulation layers, respectively, and connecting the outermost conductive layer of the first buildup layer and one of the through-hole conductor and the first conductive layer, the second buildup layer includes a plurality of interlayer resin insulation layers including the outermost interlayer resin insulation layer of the second buildup layer, and the second buildup layer has a plurality of via conductors penetrating though the plurality of interlayer resin insulation layers in the second buildup layer, respectively, and connecting the outermost conductive layer of the second buildup layer and one of the through-hole conductor and the second conductive layer.

7. The printed wiring board according to claim 1, wherein the outermost interlayer resin insulation layer of the first buildup layer includes a glass cloth comprising T-glass, and the outermost interlayer resin insulation layer of the second buildup layer includes a glass cloth comprising E-glass.

8. The printed wiring board according to claim 1, wherein the thermal expansion coefficients of the outermost interlayer resin insulation layers of the first and second buildup layers are values measured in X-Y directions and in a temperature range of 195 degrees to 280 degrees.

9. The printed wiring board according to claim 1, wherein the thermal expansion coefficients of the outermost interlayer resin insulation layers of the first and second buildup layers are values measured in X-Y directions and in a temperature range of 195 degrees to 255 degrees.

10. The printed wiring board according to claim 1, wherein the thermal expansion coefficients of the outermost interlayer resin insulation layers of the first and second buildup layers satisfy that a value obtained by dividing the thermal expansion coefficient of the outermost interlayer resin insulation layer of the second buildup layer by the thermal expansion coefficient of the outermost interlayer resin insulation layer of the first buildup layer is set in a range of greater than 1 and 1.5 or less.

11. The printed wiring board according to claim 1, wherein the outermost interlayer resin insulation layer of the first buildup layer includes a glass cloth, the outermost interlayer resin insulation layer of the second buildup layer includes a glass cloth, and the glass cloths of the outermost interlayer resin insulation layers of the first and second buildup layers satisfy that a value obtained by dividing a thermal expansion coefficient of the glass cloth in the outermost interlayer resin insulation layer of the second buildup layer by a thermal expansion coefficient of the glass cloth in the outermost interlayer resin insulation layer of the first buildup layer is set in a range of 1.5 or greater and 2.5 or less.

12. The printed wiring board according to claim 1, wherein the outermost interlayer resin insulation layers of the first and second buildup layers satisfy that a value obtained by dividing Young's modulus of the outermost interlayer resin insulation layer of the first buildup layer by Young's modulus of the outermost interlayer resin insulation layer of the second buildup layer is set in a range of from 1.05 to 2.

13. The printed wiring board according to claim 12, wherein the Young's moduli of the outermost interlayer resin insulation layers of the first and second buildup layers are values measured in X-Y directions and in a temperature range of 195 degrees to 280 degrees.

14. The printed wiring board according to claim 12, wherein the Young's moduli of the outermost interlayer resin insulation layers of the first and second buildup layers are values measured in X-Y directions and in a temperature range of 195 degrees to 260 degrees.

15. The printed wiring board according to claim 1, wherein the outermost interlayer resin insulation layer of the first buildup layer includes a glass cloth, the outermost interlayer resin insulation layer of the second buildup layer includes a glass cloth, and the glass cloths of the outermost interlayer resin insulation layers of the first and second buildup layers satisfy that a value obtained by dividing Young's modulus of the glass cloth in the outermost interlayer resin insulation layer of the first buildup layer Young's modulus of the glass cloth in the outermost interlayer resin insulation layer of the second buildup layer is set in a range of from 1.05 to 1.2.

16. The printed wiring board according to claim 1, wherein the plurality of pads is formed in a mounting region of the surface of the first buildup layer, and the mounting region has a short side in a range of from 8 mm to 15 mm and a long side in a range of from 8 mm to 15 mm.

17. The printed wiring board according to claim 1, further comprising a semiconductor device mounted on the surface of the first building layer through the plurality of pads in the first buildup layer, wherein the semiconductor device has a thickness which is set in a range of from 0.05 mm to 0.15 mm, the plurality of pads is formed in a mounting region of the surface of the first buildup layer, and the mounting region has a short side in a range of from 8 mm to 15 mm and a long side in a range of from 8 mm to 15 mm.

18. The printed wiring board according to claim 1, wherein the printed wiring board has a side set in a range of from 15 mm to 25 mm in length.

19. The printed wiring board according to claim 1, further comprising a plurality of bump structures formed on the plurality of pads, respectively.

20. The printed wiring board according to claim 1, further comprising:
 a plurality of bump structures formed on the plurality of pads, respectively; and
 a semiconductor device mounted to the plurality of pads in the first buildup layer through the plurality of bump structures such that the semiconductor device is positioned on the surface of the first building layer.

\* \* \* \* \*